(12) United States Patent
Seyama et al.

(10) Patent No.: US 6,995,960 B2
(45) Date of Patent: Feb. 7, 2006

(54) SPIN VALVE MAGNETORESISTIVE SENSOR HAVING CPP STRUCTURE

(75) Inventors: Yoshihiko Seyama, Kawasaki (JP); Atsushi Tanaka, Kawasaki (JP); Keiichi Nagasaka, Kawasaki (JP); Yutaka Shimizu, Kawasaki (JP); Shin Eguchi, Kawasaki (JP); Hitoshi Kanai, Kawasaki (JP); Reiko Kondo, Kawasaki (JP); Hitoshi Kishi, Kawasaki (JP); Junya Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 399 days.

(21) Appl. No.: 09/820,047

(22) Filed: Mar. 28, 2001

(65) Prior Publication Data

US 2002/0034055 A1 Mar. 21, 2002

(30) Foreign Application Priority Data

Sep. 21, 2000 (JP) .............................. 2000-286327
Oct. 18, 2000 (JP) .............................. 2000-317625

(51) Int. Cl.
*G11B 5/127* (2006.01)
(52) U.S. Cl. ............................... 360/324.11
(58) Field of Classification Search ........... 360/324.11, 360/324.12, 324.1, 324.2, 321, 324
See application file for complete search history.

(56) References Cited

U.S. PATENT DOCUMENTS

| | | | |
|---|---|---|---|
| 5,668,688 A * | 9/1997 | Dykes et al. ............ | 360/324.1 |
| 6,426,853 B1 * | 7/2002 | Sakai et al. ............. | 360/324.11 |
| 6,538,859 B1 * | 3/2003 | Gill ........................ | 360/324.12 |
| 6,624,985 B1 * | 9/2003 | Freitag et al. ........... | 360/324.1 |
| 6,636,391 B2 * | 10/2003 | Watanabe et al. ........... | 360/321 |
| 6,636,392 B2 * | 10/2003 | Ito et al. .................. | 360/324.1 |
| 6,657,825 B2 * | 12/2003 | Ho et al. ..................... | 360/321 |
| 6,707,649 B2 * | 3/2004 | Hasegawa et al. ..... | 360/324.12 |

FOREIGN PATENT DOCUMENTS

| | | |
|---|---|---|
| JP | 10-11720 | 1/1998 |
| JP | 10-21513 | 1/1998 |
| JP | 11-175925 | 7/1999 |
| JP | 11-213349 | 8/1999 |
| JP | 11-509956 | 8/1999 |
| JP | 11-316919 | 11/1999 |
| JP | 2000-113419 | 4/2000 |

* cited by examiner

*Primary Examiner*—Allen Cao
(74) *Attorney, Agent, or Firm*—Greer, Burns & Crain, Ltd.

(57) ABSTRACT

Disclosed herein is a spin valve magnetoresistive sensor including a first conductor layer, a free ferromagnetic layer provided on the first conductor layer, a nonmagnetic intermediate layer provided on the free ferromagnetic layer, a pinned ferromagnetic layer provided on the nonmagnetic intermediate layer, an antiferromagnetic layer provided on the pinned ferromagnetic layer, and a second conductor layer provided on the antiferromagnetic layer. At least one of the free ferromagnetic layer and the pinned ferromagnetic layer has a thickness larger than that providing a maximum resistance change rate or resistance change amount in the case of passing a current in an in-plane direction of the at least one layer. That is, the thickness of at least one of the free ferromagnetic layer and the pinned ferromagnetic layer falls in the range of 3 nm to 12 nm.

8 Claims, 35 Drawing Sheets

(a): CIP OPTIMUM LAYER THICKNESS
(b): LAMINATED FERRI
(c): INCREASED THICKNESSES OF PINNED LAYER AND INTERMEDIATE LAYER
(d): CIP OPTIMUM LAYER THICKNESS
(e): LAMINATED FERRI
(f): INCREASED THICKNESSES OF PINNED LAYER AND INTERMEDIATE LAYER

F I G. 20
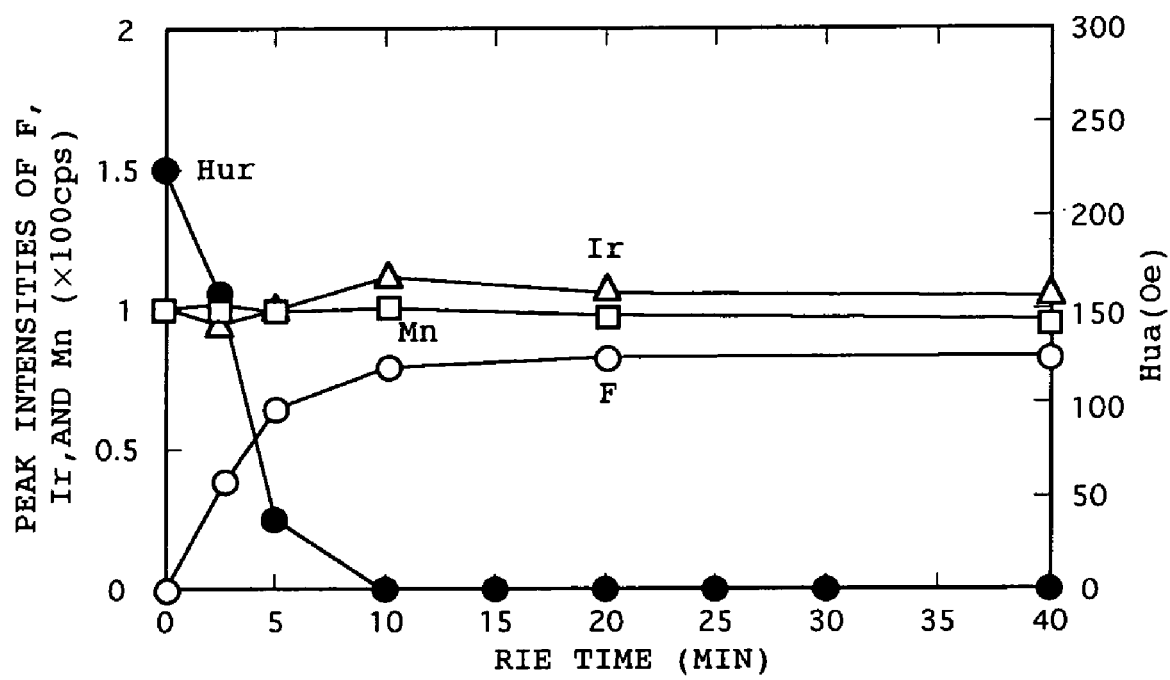

SPIN VALVE MAGNETORESISTIVE SENSOR HAVING CPP STRUCTURE

BACKGROUND OF THE INVENTION

1. Field of the Invention

The present invention relates to a spin valve magnetoresistive sensor or transducer and a spin valve magnetoresistive head using the sensor.

2. Description of the Related Art

In association with a reduction in size and an increase in recording density of a magnetic disk drive in recent years, the flying height of a head slider has become smaller and it has been desired to realize contact recording/reproduction such that the head slider flies a very small height above a recording medium or comes into contact with the recording medium. Further, a conventional magnetic induction head has a disadvantage such that its reproduction output decreases with a decrease in peripheral speed of a magnetic disk as the recording medium (relative speed between the head and the medium) caused by a reduction in diameter of the magnetic disk. To cope with this disadvantage, there has recently extensively been developed a magnetoresistive head (MR head) whose reproduction output does not depend on the peripheral speed and is capable of obtaining a large output even at a low peripheral speed. Such a magnetoresistive head is now a dominating magnetic head. Further, a magnetic head utilizing a giant magnetoresistive (GMR) effect is also commercially available at present.

With higher-density recording in a magnetic disk drive, a recording area of one bit decreases and a magnetic field generated from the medium accordingly becomes smaller. The recording density of a magnetic disk drive currently on the market is about 10 Gbit/in$^2$, and it is rising at an annual rate of about 200%. It is therefore desired to develop a magnetoresistive sensor and a magnetoresistive head which can support a minute magnetic field range and can sense a change in small external magnetic field.

At present, a spin valve magnetoresistive sensor utilizing a spin valve GMR effect is widely used in a magnetic head. In such a magnetoresistive sensor having a spin valve structure, a magnetization direction in a free ferromagnetic layer (free layer) is changed by a signal magnetic field from a recording medium, so that a relative angle of this magnetization direction to a magnetization direction in a pinned ferromagnetic layer (pinned layer) is changed, causing a change in resistance of the magnetoresistive sensor. In the case of using this magnetoresistive sensor in a magnetic head, the magnetization direction in the pinned layer is fixed to a direction along the height of a magnetoresistive element, and the magnetization direction in the free layer in the condition where no external magnetic field is applied is generally designed to a direction along the width of the magnetoresistive element, which direction is perpendicular to the pinned layer. Accordingly, the resistance of the magnetoresistive sensor can be linearly increased or decreased according to whether the direction of the signal magnetic field from the magnetic recording medium is parallel or antiparallel to the magnetization direction of the pinned layer. Such a linear resistance change facilitates signal processing in the magnetic disk drive.

In the conventional magnetoresistive sensor, a sense current is passed in a direction parallel to the film surface of the magnetoresistive element to read a resistance change according to an external magnetic field. In such a case of a CIP (Current In the Plane) structure that a current is passed in a direction parallel to the GMR film surface, the output from the sensor decreases with a decrease in sense region defined by a pair of electrode terminals. Further, in the spin valve magnetoresistive sensor having the CIP structure, insulating films are required between the GMR film and an upper magnetic shield and between the GMR film and a lower magnetic field. That is, the distance between the upper and lower magnetic shields is equal to the sum of the thickness of the GMR film and a value twice the thickness of each insulating film. At present, the thickness of the insulating film is about 20 nm at the minimum. Accordingly, the distance between the upper and lower magnetic shields becomes equal to the sum of the thickness of the GMR film and about 40 nm. However, with this distance, it is difficult to support a reduction in length of a recording bit on the recording medium, and the current CIP spin valve magnetoresistive sensor cannot meet the requirement that the distance between the magnetic shields is to be reduced to 40 nm or less.

In these circumstances, it is considered that a magnetic head having a CIP structure utilizing a spin valve GMR effect can support a recording density of 20 to 40 Gbit/in$^2$ at the maximum. Even by applying specular scattering as a latest technique, the maximum recording density is considered to be 60 Gbit/in$^2$. As mentioned above, the increase in recording density of a magnetic disk drive is rapid, and it is expected that a recording density of 80 Gbit/in$^2$ will be desired by year 2002. When the recording density becomes 80 Gbit/in$^2$ or higher, it is very difficult to support such a high recording density even by using a CIP spin valve GMR magnetic head to which the latest specular scattering is applied, from the viewpoints of output and the distance between the magnetic shields.

As a post spin valve GMR intended to cope with the above problem, there have been proposed a tunnel MR (TMR) and a multilayer CPP (Current Perpendicular to the Plane) structure. The TMR has a structure that a thin insulating layer is sandwiched between two ferromagnetic layers. The amount of a tunnel current passing across the insulating layer is changed according to the magnetization directions in the two ferromagnetic layers. The TMR shows a very large resistance change and has a good sensitivity, so that it is expected as a promising post spin valve GMR. On the other hand, the multilayer CPP structure has an effect that when a current is passed in a direction perpendicular to the film surface of a GMR film (in a direction including at least a vertical component), the resistance change in the GMR film is almost doubled at room temperature, thereby improving the output. Further, in the case of the CPP structure, the output increases with a decrease in sectional area of a portion of the GMR film where a sense current is passed. This feature of the CPP structure is a large advantage over the CIP structure.

The TMR is also considered to be a kind of CPP structure, because a current is passed across the insulating layer from one of the ferromagnetic layers to the other ferromagnetic layer. Therefore, the TMR also has the above advantage. Thus, the TMR and the multilayer CPP structure are promising. However, these structures have not yet been put to practical use, and have some problems.

For example, the multilayer CPP structure has the following problems.

(1) An element (device) fabrication process is complicated to require a high accuracy.

In fabricating a device having the multilayer CPP structure, a process including film formation, resist formation, ion milling or reactive ion etching (RIE), and resist removal must be repeated at least three times, and a very high positioning accuracy is required in the step of resist formation. Further, in the step of ion milling or reactive ion etching, a technique of stopping the milling or etching in the middle of the thickness of a metal layer before reaching a substrate surface is also required.

(2) The evaluation of characteristics is difficult unless the size of a CPP portion is about 1 μm or submicrons.

When the size of a CPP portion becomes about 3 μm or more, a voltage to a sense current is measured as a negative value by the influence of current distribution. As a result, in the case that the size of the CPP portion is about 3 μm, the MR ratio becomes a very large value. Accordingly, a conventional evaluation standard cannot be applied.

(3) The characteristics are largely dependent on whether or not the device fabrication process is well performed.

While this tendency also applies to a conventional GMR having a CIP structure, it is remarkable in the case of the CPP structure. That is, the characteristics of the GMR largely change according to a sectional shape or a condition of generation of burrs in processing a GMR film or an insulating film. Accordingly, it is difficult to determine the cause of generation of defectives.

(4) Hysteresis is present, magnetic domain control is difficult, and the thickness of a portion for sensing an external magnetic field is large.

Magnetic layers in the multilayer CPP structure are magnetically connected with each other to cause the presence of hysteresis. Further, the number of the magnetic layers is large and it is therefore difficult to perform magnetic domain control of each magnetic layer. Further, all the magnetic layers basically sense an external magnetic field to change the magnetization direction in each magnetic layer, so that the thickness of a portion for sensing an external magnetic field is large.

The above problems (1) to (3) can be solved by improving the element structure and the processing accuracy, for example. However, the problem (4) is a fundamental problem of the multilayer GMR, and there are no specific measures for solving this problem at present.

It is expected that the GMR element will be increasingly minute in structure with a further increase in recording density and that high-yield production of GMR elements will be difficult in the conventional process of directly polishing each GMR element in its vertical direction, from the viewpoint of its processing accuracy. In this respect, there is also known a flux guide type GMR head which can eliminate the need for direct polishing of the GMR element in its vertical direction. In the case of using such a flux guide type GMR head as a conventional CIP structure, the flux guide and the GMR element must be insulated to prevent a current from separately flowing to the flux guide.

Accordingly, the flux guide and the GMR element must be sufficiently separated from each other, so that a magnetic field from the medium cannot be sufficiently transferred from the flux guide to the GMR element, causing a reduction in reproduction output. Further, when the GMR element portion is processed minutely as in the conventional CPP structure, the region where magnetization is not moved by a demagnetizing field on the end surface becomes large, causing a reduction in reproduction sensitivity.

The GMR head has a problem such that when the GMR film does not become a single magnetic domain, Barkhausen noise is generated to cause large variations in reproduction output. To cope with this problem, a magnetic domain control film for controlling a magnetic domain in the GMR film is provided. As the magnetic domain control film, a hard magnetic film formed from a high-coercivity film is used to control the magnetization direction in the free layer to a direction along the width of the element by a bias magnetic field generated from the hard magnetic film.

The intensity and distribution of the magnetic field generated from the hard magnetic film is strongly dependent on the shape of the hard magnetic film. The shape of the hard magnetic film usually formed by a lift-off process or the like is influenced by the process accuracy, and it is therefore difficult to obtain a stable bias magnetic field. In the case that the hard magnetic film has such a shape as to ride over the element, the bias magnetic field is partially applied in a direction opposite to a desired magnetization control direction, thus inducing the generation of Barkhausen noise or the like. As a result, it is considered that the element characteristics are degraded.

To cope with this problem, there is provided an exchange bonding type magnetic domain control method including the steps of laminating antiferromagnetic layers as bias magnetic field applying layers on the opposite ends of the free layer and controlling the magnetization direction in the free layer by utilizing the exchange bonding between the free layer and each antiferromagnetic layer. According to this method, the exchange bonding between the magnetic layers is utilized, so that it is possible to obtain a stabler bias effect than that by the above control method using the magnetic field from the hard magnetic film. In the case of forming such an exchange bonding type magnetic domain control element, a sufficient bias magnetic field can be obtained by continuously forming the free layer and the antiferromagnetic layer as a bias magnetic field applying layer.

However, the bias magnetic field at a magnetic field sensing portion of the free layer must be eliminated to improve the element sensitivity. In the case that the antiferromagnetic layer is formed of a less durable material such as FeMn, the antiferromagnetic layer is made to react with oxygen to form an oxide of constitutive elements of the antiferromagnetic layer, thereby eliminating the bias magnetic field at the magnetic field sensing portion. However, a more durable material such as NiMn, PtMn, PdPtMn, or IrMn than FeMn is now used as the material of the antiferromagnetic layer from the viewpoint of reliability of the magnetic head. As a result, the resistance of the antiferromagnetic layer against oxidation is improved to cause a problem that the process of eliminating the bias magnetic field from the magnetic field sensing portion becomes difficult.

SUMMARY OF THE INVENTION

It is an object of the present invention to provide a spin valve magnetoresistive sensor having a CPP structure which can solve the problems in the conventional multilayer CPP structure to obtain a large resistance change amount with high sensitivity.

It is another object of the present invention to provide a spin valve magnetoresistive head having a CPP structure and a flux guide which can attain high-yield mass production.

It is a further object of the present invention to provide a spin valve magnetoresistive sensor which can stably perform magnetic domain control of a free ferromagnetic layer by an exchange bonding force between the free ferromagnetic layer and an antiferromagnetic layer, and can achieve high sensitivity and reliability.

In accordance with an aspect of the present invention, there is provided a magnetoresistive sensor including a first conductor layer; a free ferromagnetic layer provided on the first conductor layer; a nonmagnetic intermediate layer provided on the free ferromagnetic layer; a pinned ferromagnetic layer provided on the nonmagnetic intermediate layer; an antiferromagnetic layer provided on the pinned ferromagnetic layer; and a second conductor layer provided on the antiferromagnetic layer; at least one of the free ferromagnetic layer and the pinned ferromagnetic layer having a thickness larger than that providing a maximum resistance change rate or resistance change amount in the case of passing a current in an in-plane direction of the at least one layer.

The free ferromagnetic layer, the nonmagnetic intermediate layer, the pinned ferromagnetic layer, and the antiferromagnetic layer constitute a spin valve film. In the spin valve film, only the free ferromagnetic layer is a layer for basically sensing a magnetic field to change a magnetization direction therein. Accordingly, by forming the spin valve film into a CPP spin valve structure, the present invention can solve the problems that the magnetic domain control of each magnetic layer in the conventional multilayer GMR film is difficult and that the thickness of an external magnetic field sensing portion is large. Further, no magnetic bond is basically present between the magnetic layers constituting the spin valve film in the present invention, so that the hysteresis can be reduced. Thus, the problem (4) in the above-mentioned multilayer CPP structure can be solved.

Preferably, the thickness of at least one of the free ferromagnetic layer and the pinned ferromagnetic layer falls in the range of 0.5 to 2.0 times the mean free path of conduction electrons in a spin direction not spin-dependently scattered in a magnetization direction of the at least one layer. In other words, the thickness of at least one of the free ferromagnetic layer and the pinned ferromagnetic layer falls in the range of 3 nm to 12 nm. Preferably, at least one of the pinned ferromagnetic layer and the free ferromagnetic layer has a laminated ferri structure. Preferably, the nonmagnetic intermediate layer is formed of Cu, and has a thickness falling in the range of 4 nm to 6 nm.

In accordance with another aspect of the present invention, there is provided a magnetoresistive sensor including a first conductor layer; a first antiferromagnetic layer provided on the first conductor layer; a first pinned ferromagnetic layer provided on the first antiferromagnetic layer; a first nonmagnetic intermediate layer provided on the first pinned ferromagnetic layer; a free ferromagnetic layer provided on the first nonmagnetic intermediate layer; a second nonmagnetic intermediate layer provided on the free ferromagnetic layer; a second pinned ferromagnetic layer provided on the second nonmagnetic intermediate layer; a second antiferromagnetic layer provided on the second pinned ferromagnetic layer; and a second conductor layer provided on the second antiferromagnetic layer.

Preferably, at least one of the first pinned ferromagnetic layer, the second pinned ferromagnetic layer, and the free ferromagnetic layer has a thickness falling in the range of 3 nm to 12 nm. Preferably, at least one of the first and second pinned ferromagnetic layer and the free ferromagnetic layer has a laminated ferri structure.

In accordance with a further aspect of the present invention, there is provided a magnetoresistive head for reproducing information recorded on a recording medium, including a first electrode terminal; a spin valve magnetoresistive element provided on the first electrode terminal at a position retracted from a medium opposing surface of the head, for converting a change in signal magnetic field leaked from the recording medium into a resistance change; a first flux guide having one end exposed to the medium opposing surface and another end overlapping one end of the spin valve magnetoresistive element, for guiding a magnetic flux from the recording medium to the spin valve magnetoresistive element; a second flux guide having one end overlapping the other end of the spin valve magnetoresistive element; and a second electrode terminal provided on the spin valve magnetoresistive element.

Preferably, at least one of the first and second flux guides is in contact with the spin valve magnetoresistive element. More preferably, at least one of the first and second electrode terminals is in contact with a part of a film surface of the spin valve magnetoresistive element, and the at least one electrode terminal is smaller in size than the spin valve magnetoresistive element in the film surface.

In accordance with a still further aspect of the present invention, there is provided a magnetoresistive head for reproducing information recorded on a recording medium, including a first magnetic shield; an insulating layer provided on the first magnetic shield; a spin valve magnetoresistive element provided on the insulating layer at a position retracted from a medium opposing surface of the head, for converting a change in signal magnetic field leaked from the recording medium into a resistance change; a first flux guide having one end exposed to the medium opposing surface and another end overlapping one end of the spin valve magnetoresistive element, for guiding a magnetic flux from the recording medium to the spin valve magnetoresistive element; a second flux guide having one end in contact with the other end of the spin valve magnetoresistive element; an electrode terminal provided on the spin valve magnetoresistive element; a second magnetic shield provided on the electrode terminal; and a flux path for connecting the second flux guide and the first magnetic shield.

With this arrangement, the first magnetic shield is electrically connected through the flux path and the second flux guide to the spin valve magnetoresistive element. Accordingly, the first magnetic shield functions as another electrode terminal.

In accordance with a still further aspect of the present invention, there is provided a magnetoresistive sensor including a first antiferromagnetic layer; a pinned ferromagnetic layer provided on the first antiferromagnetic layer; a nonmagnetic intermediate layer provided on the pinned ferromagnetic layer; a free ferromagnetic layer provided on the nonmagnetic intermediate layer; and a second antiferromagnetic layer provided on the free ferromagnetic layer for performing magnetic domain control of the free ferromagnetic layer by an exchange bonding force; a portion of the second antiferromagnetic layer contacting a magnetic field sensing portion of the free ferromagnetic layer being formed of a compound of constitutive elements of the second antiferromagnetic layer and a reactive element selected from the group consisting of fluorine and chlorine.

Preferably, the second antiferromagnetic layer is formed of an alloy selected from the group consisting of NiMn, PtMn, PdPtMn, and IrMn.

In accordance with a still further aspect of the present invention, there is provided a manufacturing method for a magnetoresistive sensor, including the steps of forming a first antiferromagnetic layer; forming a pinned ferromagnetic layer on the first antiferromagnetic layer; forming a nonmagnetic intermediate layer on the pinned ferromagnetic layer; forming a free ferromagnetic layer on the nonmagnetic intermediate layer; forming a second antiferromagnetic layer for performing magnetic domain control of the free ferromagnetic layer, on the free ferromagnetic layer; and applying a reactive element selected from the group consisting of fluorine and chlorine to a portion of the second antiferromagnetic layer contacting a magnetic field sensing portion of the free ferromagnetic layer to thereby form a compound of constitutive elements of the second antiferromagnetic layer and the reactive element at the portion of the second antiferromagnetic layer.

In accordance with a still further aspect of the present invention, there is provided a magnetoresistive head comprising: a lower electrode; a magnetoresistive film provided on said lower electrode; magnetic domain control films provided on the opposite sides of said magnetoresistive film; an upper electrode provided on said magnetoresistive film and said magnetic domain control films; and a planarizing film provided between said upper electrode and said lower electrode so as to embed said magnetoresistive film and said magnetic domain control films.

In accordance with a still further aspect of the present invention, there is provided a manufacturing method for a magnetoresistive head, comprising the steps of: sequentially laminating a lower electrode, a magnetoresistive film, and a protective film formed of a soft magnetic material on a substrate; performing first etching of said magnetoresistive film and said protective film into a given shape; depositing a planarizing film including a magnetic domain control film over said substrate; performing first planarization of said planarizing film to fill a portion removed by said first etching with said planarizing film by using a planarization technique; performing second etching of said magnetoresistive film, said protective film, and said planarizing film into a given shape after said first planarization; depositing an insulating film over said substrate; performing second planarization of said insulating film to fill a portion removed by said second etching with said insulating film by using the planarization technique; and depositing an upper electrode over said substrate to bring said upper electrode into contact with said protective film.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 20 is a graph showing the relation between peak intensities of F, Ir, and Mn and Hua acting on a free layer when the spin valve GMR film is subjected to RIE using $SF_6$;

FIGS. 22A to 22I and FIGS. 22A' to 22I' are plan views and sectional views, respectively, showing a magnetoresistive head manufacturing process according to a fourth preferred embodiment of the present invention;

DETAILED DESCRIPTION OF THE PREFERRED EMBODIMENTS

Figure 1:
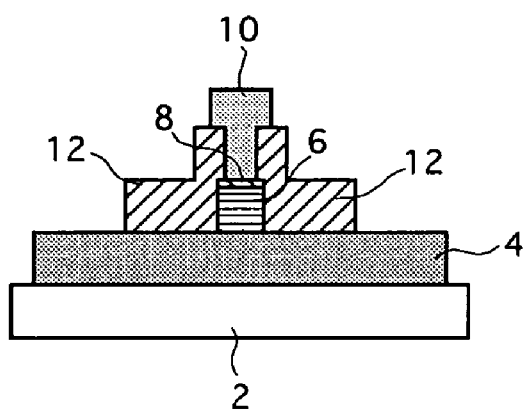
FIG. 1 is a schematic view of a CPP spin valve magnetoresistive sensor according to a first preferred embodiment of the present invention.

Some preferred embodiments of the present invention will now be described in detail with reference to the drawings. Throughout the drawings, substantially the same parts are denoted by the same reference numerals, and the description thereof will be omitted to avoid repetition.

Referring to FIG. 1, there is shown a sectional view of a spin valve magnetoresistive sensor having a CPP (Current Perpendicular to the Plane) structure according to a first preferred embodiment of the present invention. A lower terminal 4 composed of a Cu film having a thickness of 400 nm and an Au film having a thickness of 100 nm is formed on an $Al_2O_3$-TiC substrate 2. A spin valve giant magnetoresistive film (GMR film) 6 is formed on the lower terminal 4.

A cap layer 8 composed of a Cu film having a thickness of 10 nm and an Au film having a thickness of 10 nm is formed on the GMR film 6. An upper terminal 10 composed of a Cu film having a thickness of 300 nm is formed on the cap layer 8. Reference numeral 12 denotes an insulating layer composed of an $SiO_2$ film having a thickness of 150 nm.

The magnetoresistive sensor of the present invention is characterized in that the GMR film 6 has a spin valve structure and a CPP structure in which a sense current is passed in a direction perpendicular to the film surface. The present inventor has considered to obtain a large resistance change in a CPP spin valve magnetoresistive sensor by increasing the thicknesses of a pinned ferromagnetic layer (which will be hereinafter referred to as a pinned layer), a nonmagnetic intermediate layer (which will be hereinafter referred to as an intermediate layer), and a free ferromagnetic layer (which will be hereinafter referred to as a free layer) to draw out bulk scattering to the maximum. Even when the thickness of an antiferromagnetic layer, an under layer, and a surface protective layer (cap layer) are increased, the resistance change does not become large. The following effects are considered to be made by increasing the thicknesses of the pinned layer, the intermediate layer, and the free layer.

(1) With an increase in thickness of the pinned layer, Hua (the strength of bonding between the antiferromagnetic layer and the pinned layer) becomes small and the sensitivity of the free layer becomes small because of a large leakage field, causing a difficulty of adjustment of a bias point. By forming the pinned layer into a laminated ferri structure, Hua can be enlarged and the leakage field can be reduced.

(2) With an increase in thickness of the free layer, a large amount of external magnetic field for changing a magnetization direction is required, causing a decrease in sensitivity of the free layer. Also in this respect, by forming the free layer into a laminated ferri structure, the magnetization direction in the free layer can be changed by a small external magnetic field, so that the sensitivity can be increased. In the case of increasing the thicknesses of the pinned layer and the free layer, it is preferable to increase the thickness of the intermediate layer, so as to cut a magnetic bond between the pinned layer and the free layer.

(3) The GMR film is formed into a dual spin valve structure. In this case, not only the thicknesses of the pinned layer, the intermediate layer, and the free layer are increased, but also the number of interfaces is increased. Accordingly, a resistance change due to interfacial scattering also becomes large, and this structure is effective in improving a resistance change amount.

It is more effective to apply at least two of the above measures (1) to (3) in combination rather than solely. In the above measures (1) and (2), the thicknesses of the pinned layer and/or the free layer cannot be unconditionally increased. The present inventor has adopted CoFeB as the material for each of the pinned layer and the free layer, and experimentally obtained an optimum value of the thickness of each layer. As the experimental result, it has been found that the resistance change amount can be increased by making the thickness of at least one of the pinned layer and the free layer larger than an optimum value in a CIP (Current In the Plane) structure.

In other words, one feature of the present invention is that at least one of the free layer and the pinned layer has a thickness larger than the thickness providing a maximum resistance change amount in the case of passing a current in a direction parallel to the film surface (in-plane direction).

Preferably, the thickness of at least one of the free layer and the pinned layer falls in the range of 3 nm to 12 nm, more preferably in the range of 5 nm to 7 nm. Preferably, the thickness of the intermediate layer falls in the range of 4 nm to 6 nm. In other words, the thickness of at least one of the free layer and the pinned layer falls preferably in the range of 0.5 to 2.0 times the mean free path of conduction electrons in the spin direction not spin-dependently scattered in the magnetization direction of the layer. More preferably, the thickness of the free layer or the pinned layer is substantially equal to the mean free path of conduction electrons in the spin direction not spin-dependently scattered.

This is considered to be due to the fact that when electrons pass the layer having a thickness substantially equal to the mean free path, the difference in electrical resistance between the electrons not spin-dependently scattering and the electrons spin-dependently scattering becomes a maximum. In actuality, when the thickness of the layer exceeds a value about twice the mean free path, it is considered that the possibility of changing of electron spin becomes large to cause a decrease in resistance change amount. By taking this concept further, the thicknesses of the free layer and the pinned layer can be optimized with the mean free path of conduction electrons in the spin direction not spin-dependently scattered not only in the case that the free layer and the pinned layer are formed of CoFeB, but also in the case that the free layer and the pinned layer are formed of another ferromagnetic material or two or more kinds of ferromagnetic materials in combination.

Figure 2:
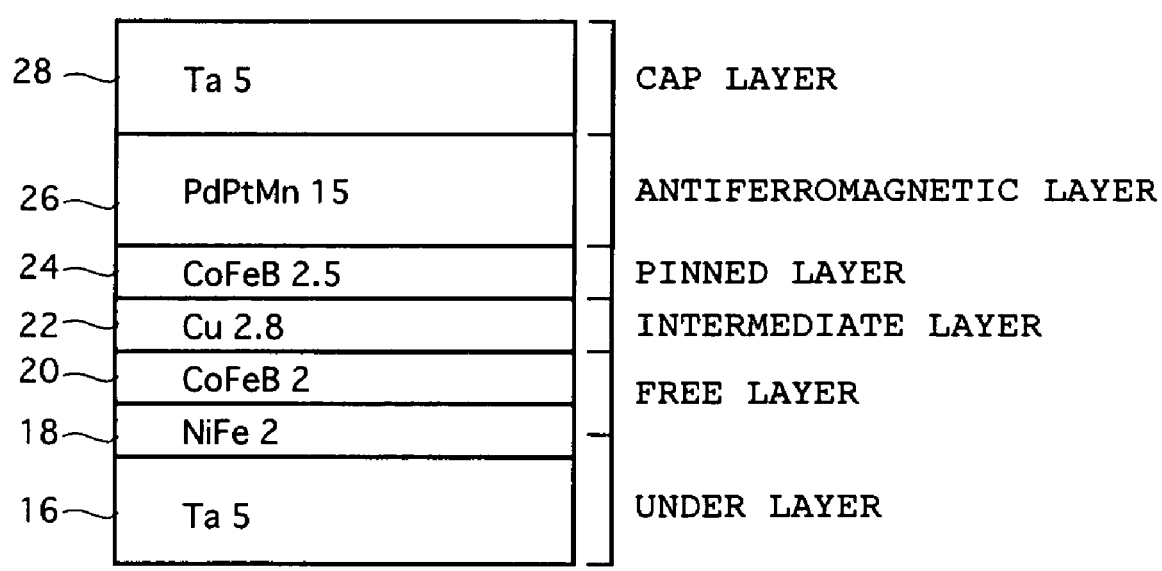
FIG. 2 is a schematic illustration of the configuration of a sample (a)

Various film configurations of the spin valve GMR film 6 will now be described with reference to FIGS. 2 to 9. Referring to FIG. 2, there is shown a film configuration of a sample (a) of the spin valve GMR film 6. The sample (a) is a single spin valve with CIP optimum layer thickness. A Ta layer 16 having a thickness of 5 nm is formed on the lower terminal layer 4 by sputtering. All the following layers are also formed by sputtering. A NiFe layer 18 having a thickness of 2 nm is formed on the Ta layer 16. The Ta layer 16 and a part of the NiFe layer 18 constitute an under layer.

A CoFeB layer 20 having a thickness of 2 nm is formed on the NiFe layer 18. A part of the NiFe layer 18 and the CoFeB layer 20 constitute a free layer. A Cu intermediate layer 22 having a thickness of 2.8 nm is formed on the CoFeB layer 20. A CoFeB pinned layer 24 having a thickness of 2.5 nm is formed on the Cu intermediate layer 22. A PdPtMn antiferromagnetic layer 26 having a thickness of 15 nm is formed on the CoFeB pinned layer 24. A Ta cap layer 28 having a thickness of 5 nm is formed on the antiferromagnetic layer 26. The cap layer 28 functions to protect the antiferromagnetic layer 26.

Figure 3:
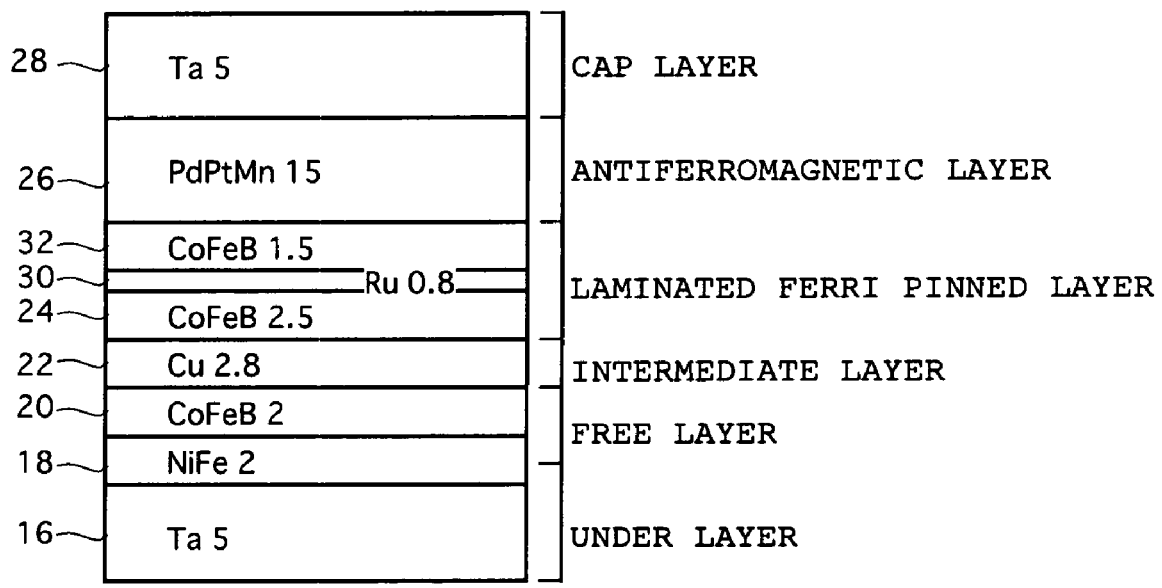
FIG. 3 is a schematic illustration of the configuration of a sample (b)

Referring to FIG. 3, there is shown a film configuration of a sample (b) of the spin valve GMR film 6. The sample (b) is a single spin valve with CIP optimum layer thickness in which the pinned layer is formed into a laminated ferri structure. The sample (b) is different from the sample (a) only in the configuration of the pinned layer, and the configuration of the other layers is similar to that of the sample (a). That is, in the sample (b), a CoFeB layer 24 having a thickness of 2.5 nm is formed on the Cu intermediate layer 22; a Ru layer 30 having a thickness of 0.8 nm is formed on the CoFeB layer 24; and a CoFeB layer 32 having a thickness of 1.5 nm is formed on the Ru layer 30. Thus, the two CoFeB layers 24 and 32 separated by the Ru layer 30 constitute a laminated ferri pinned layer. While the free layer, the intermediate layer, the pinned layer, and the antiferromagnetic layer are laminated in this order on the under layer 16 as shown in FIG. 2, the order of lamination of these layers may be reversed.

Figure 4:
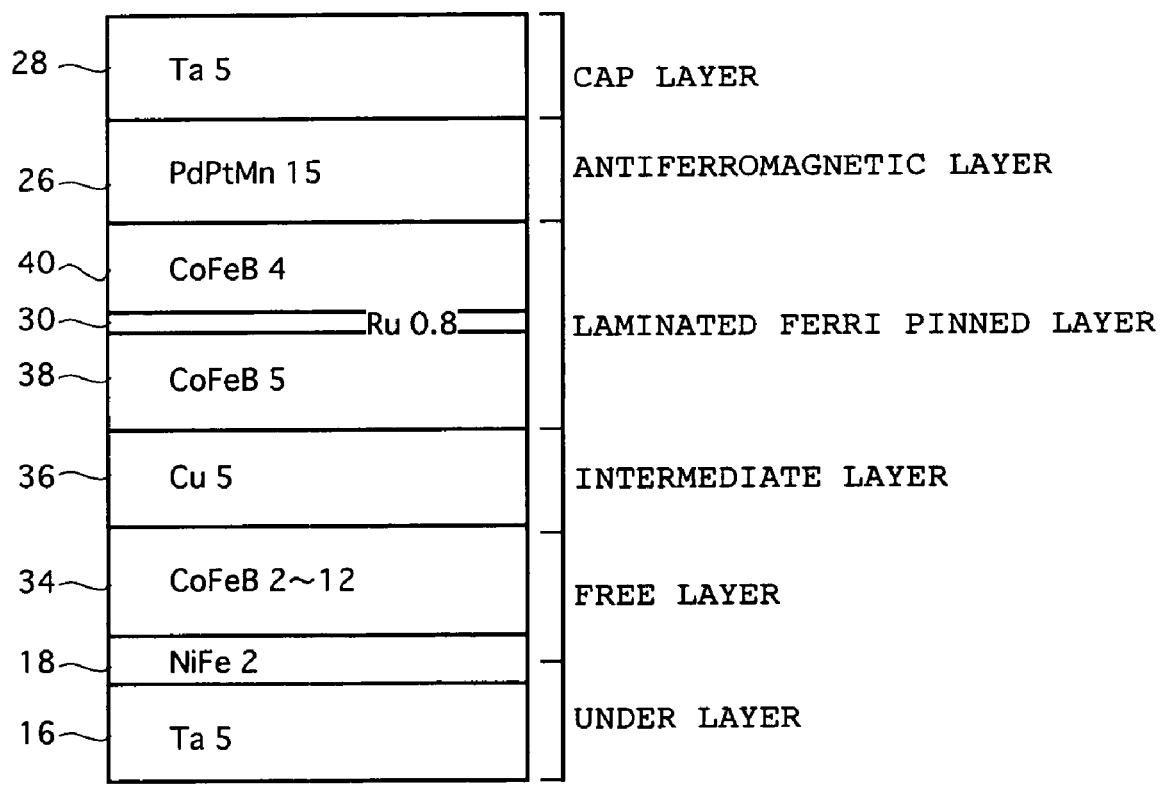
FIG. 4 is a schematic illustration of the configuration of a sample (c)

Referring to FIG. 4, there is shown a film configuration of a sample (c) of the spin valve GMR film 6. The sample (c) is a single spin valve in which the thicknesses of the pinned layer and the intermediate layer are increased, and the pinned layer is formed into a laminated ferri structure. The thickness of a Cu intermediate layer 36 is increased to 5 nm, and the laminated ferri pinned layer is composed of two CoFeB layers 38 and 40 respectively having increased thicknesses of 5 nm and 4 nm and a Ru layer 30 separating the two CoFeB layers 38 and 40. Further, the thickness of a CoFeB free layer 34 was changed in the range of 2 nm to 12 nm, and a resistance change amount according to the change in thickness of the CoFeB free layer 34 was measured.

Figure 5:
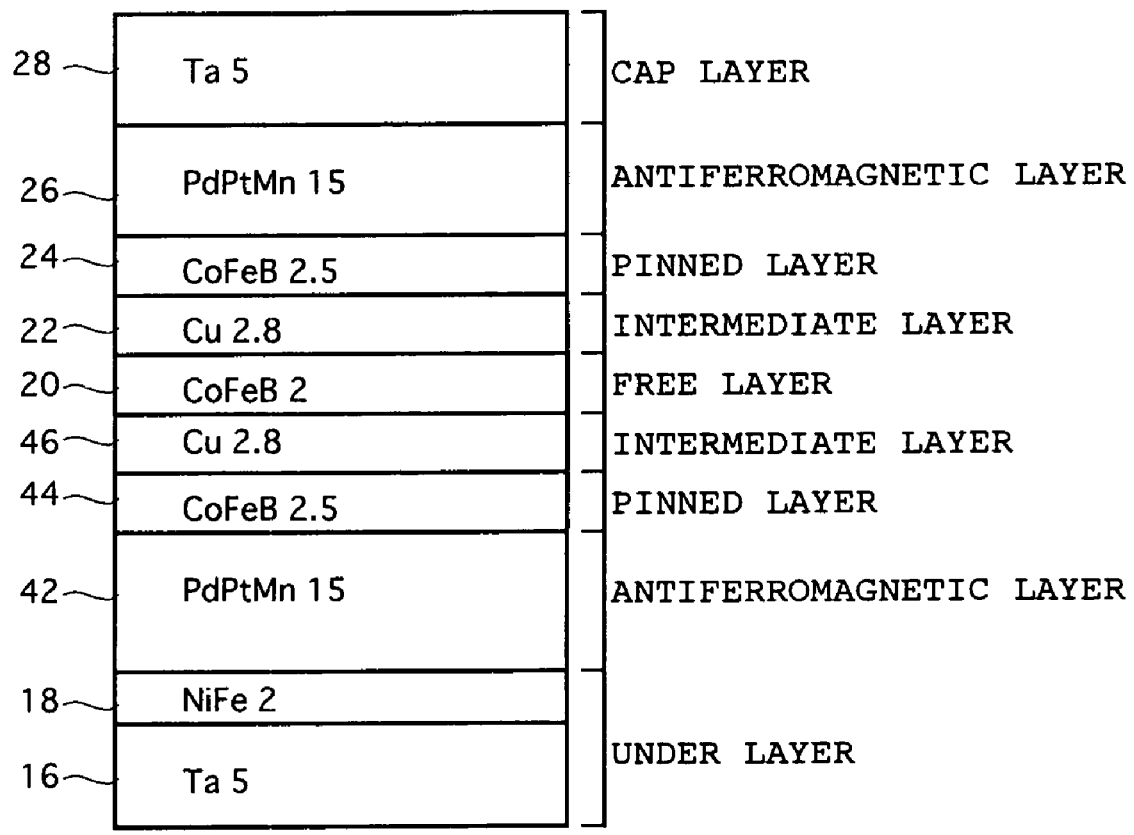
FIG. 5 is a schematic illustration of the configuration of a sample (d)

Referring to FIG. 5, there is shown a film configuration of a sample (d) of the spin valve GMR film 6. The sample (d) is a dual spin valve with CIP optimum layer thickness. In the sample (d), the under layer is composed of a Ta layer 16 having a thickness of 5 nm and a NiFe layer 18 having a thickness of 2 nm. A PdPtMn antiferromagnetic layer 42 having a thickness of 15 nm is formed on the under layer. A CoFeB pinned layer 44 having a thickness of 2.5 nm is formed on the antiferromagnetic layer 42, and a Cu intermediate layer 46 having a thickness of 2.8 nm is formed on the CoFeB pinned layer 44. Like the sample (a), a CoFeB free layer 20, Cu intermediate layer 22, CoFeB pinned layer 24, PdPtMn antiferromagnetic layer 26, and Ta cap layer 28 are sequentially formed on the Cu intermediate layer 46.

Figure 6:
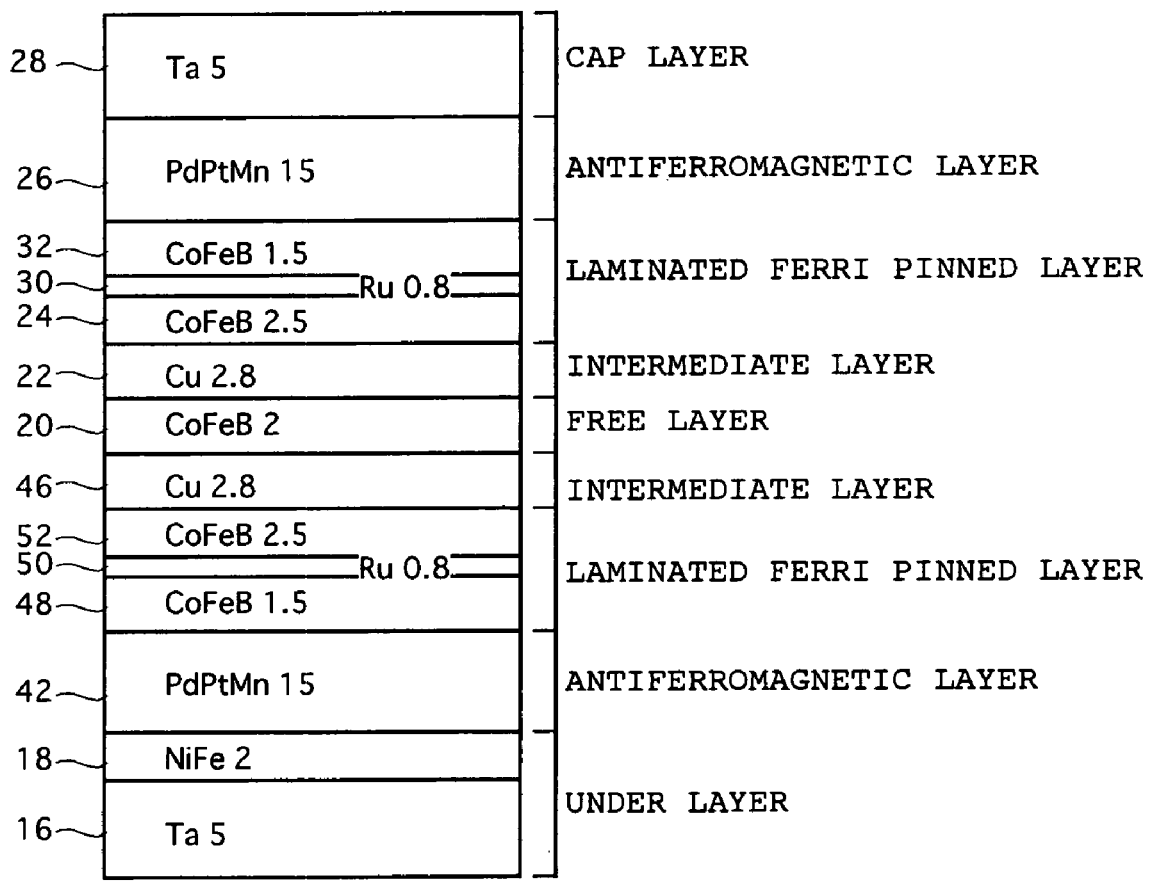
FIG. 6 is a schematic illustration of the configuration of a sample (e)

Referring to FIG. 6, there is shown a film configuration of a sample (e) of the spin valve GMR film 6. The sample (e) is a dual spin valve with CIP optimum layer thickness and two pinned layers each having a laminated ferri structure. That is, a CoFeB layer 48 having a thickness of 1.5 nm is formed on the PdPtMn antiferromagnetic layer 42. A Ru layer 50 having a thickness of 0.8 nm is formed on the CoFeB layer 48, and a CoFeB layer 52 having a thickness of 2.5 nm is formed on the Ru layer 50. Thus, the two CoFeB layers 48 and 52 separated by the Ru layer 50 constitute a laminated ferri structure. Further, like the sample (b), a CoFeB free layer 20, a Cu intermediate layer 22, and a laminated ferri pinned layer composed of two CoFeB layers 24 and 32 separated by a Ru layer 30 are formed on the Cu intermediate layer 46. Further, a PdPtMn antiferromagnetic layer 26 is formed on the laminated ferri pinned layer, and a Ta cap layer 28 is formed on the antiferromagnetic layer 26.

Figure 7:
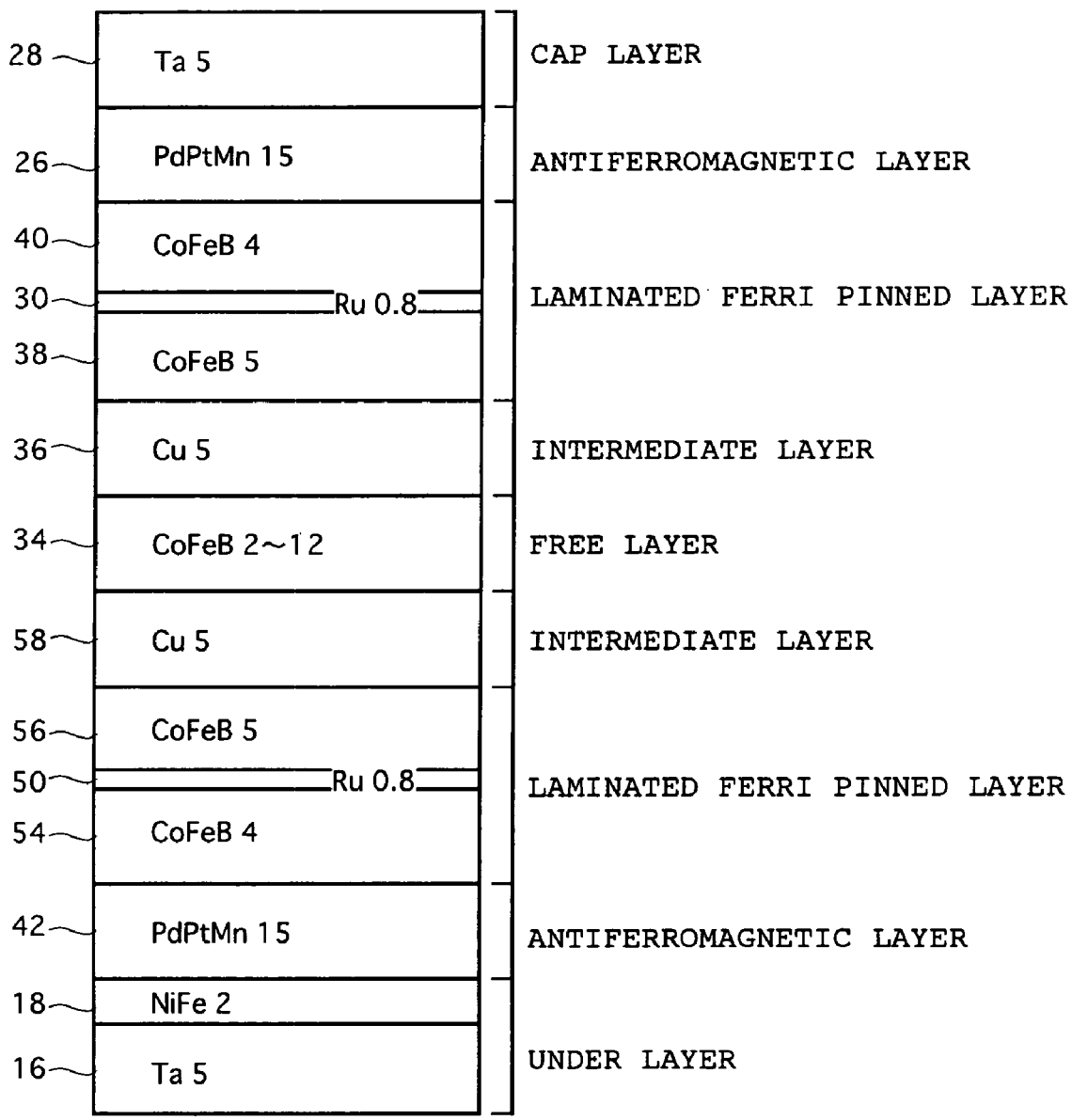
FIG. 7 is a schematic illustration of the configuration of a sample (f)

Referring to FIG. 7, there is shown a film configuration of a sample (f) of the spin valve GMR film 6. The sample (f) is a dual spin valve with increased thicknesses of two pinned layers and two intermediate layers in which each pinned layer has a laminated ferri structure. That is, a CoFeB layer 54 having a thickness of 4 nm is formed on the PdPtMn antiferromagnetic layer 42; a Ru layer 50 having a thickness of 0.8 nm is formed on the CoFeB layer 54; and a CoFeB layer 56 having a thickness of 5 nm is formed on the Ru layer 50.

The two CoFeB layers 54 and 56 separated by the Ru layer 50 constitute a laminated ferri pinned layer. A Cu intermediate layer 58 having a thickness of 5 nm is formed on the CoFeB layer 56. Like the sample (c) shown in FIG. 4, a free layer 34, an intermediate layer 36, a laminated ferri pinned layer 38, 30, 40, an antiferromagnetic layer 26, and a cap layer 28 are formed on the Cu intermediate layer 58. Further, like the sample (c), the thickness of the CoFeB free layer 34 was changed in the range of 2 nm to 12 nm, and a resistance change amount according to the change in thickness of the free layer 34 was measured.

Figure 8:
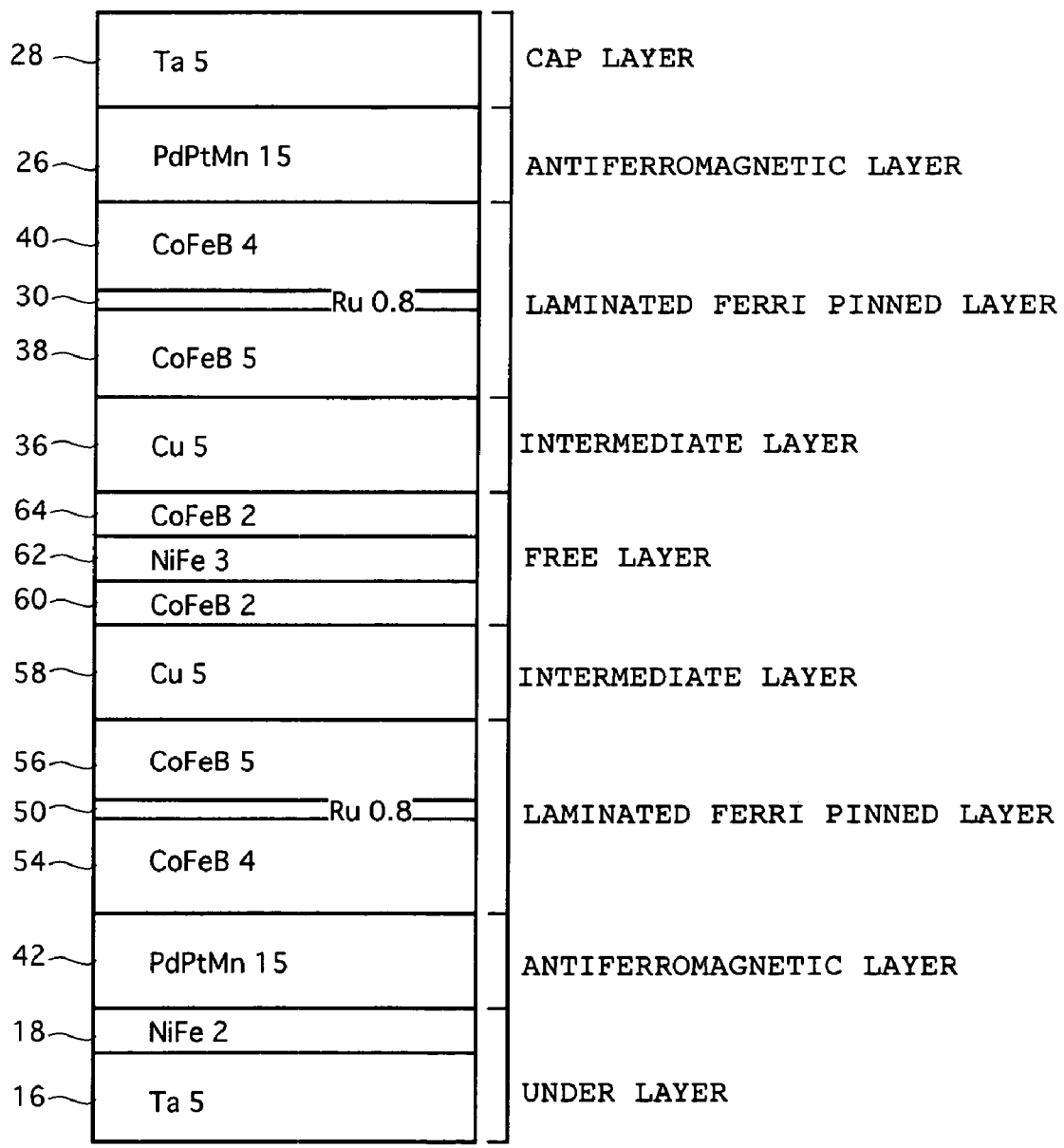
FIG. 8 is a schematic illustration of the configuration of a sample (g)

Referring to FIG. 8, there is shown a film configuration of a sample (g) of the spin valve GMR film 6. The sample (g) is similar to the sample (f) shown in FIG. 7 in the point that the thicknesses of each pinned layer and each intermediate layer are increased, and is different from the sample (f) in the point that the free layer is composed of a CoFeB layer 60 having a thickness of 2 nm, a NiFe layer 62 having a thickness of 3 nm, and a CoFeB layer 64 having a thickness of 2 nm.

Figure 9:
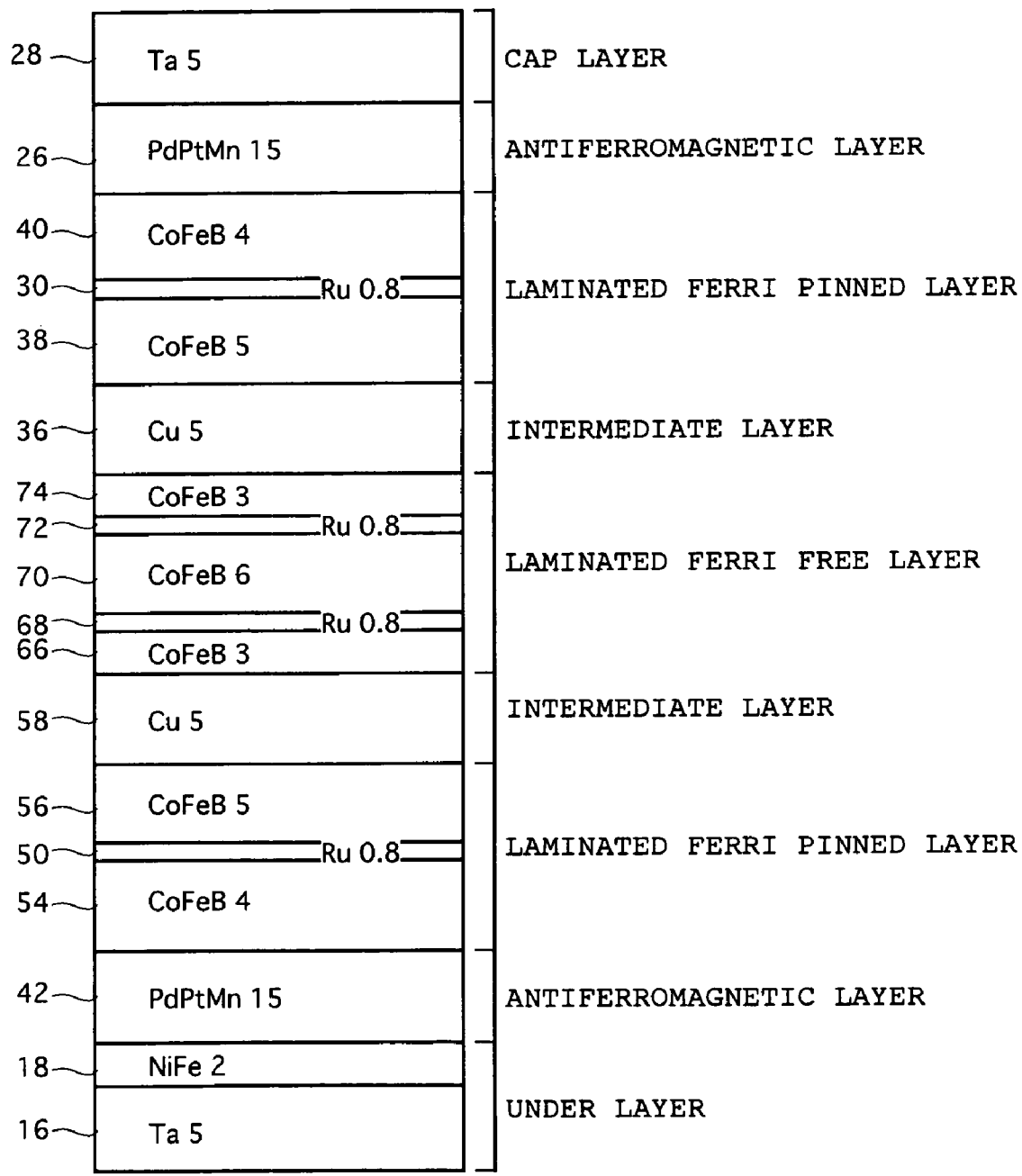
FIG. 9 is a schematic illustration of the configuration of a sample (h)

Referring to FIG. 9, there is shown a film configuration of a sample (h) of the spin valve GMR film 6. The sample (h) is similar to the sample (f) shown in FIG. 7 with the exception that the free layer has a laminated ferri structure. That is, a CoFeB layer 66 having a thickness of 3 nm is formed on the Cu intermediate layer 58; a Ru layer 68 having a thickness of 0.8 nm is formed on the CoFeB layer 66; a CoFeB layer 70 having a thickness of 6 nm is formed on the Ru layer 68; a Ru layer 72 having a thickness of 0.8 nm is formed on the CoFeB layer 70; and a CoFeB layer 74 having a thickness of 3 nm is formed on the Ru layer 72. Thus, the three CoFeB layers 66, 70, and 74 separated by the two Ru layers 68 and 72 constitute a laminated ferri structure.

In each of the dual spin valves of the samples (d) to (h) shown in FIGS. 5 to 9, two, upper and lower pinned layers are provided and only one free layer is provided between the upper and lower pinned layers. Although not specifically shown, the present invention also includes a dual spin valve magnetoresistive sensor having a laminated structure such that two, upper and lower free layers are provided and only one antiferromagnetic layer is provided between the upper and lower free layers as described below.

That is, this dual spin valve magnetoresistive sensor comprises a first conductor layer, a first free ferromagnetic layer provided on the first conductor layer, a first nonmagnetic intermediate layer provided on the first free ferromagnetic layer, a first pinned ferromagnetic layer provided on the first nonmagnetic intermediate layer, an antiferromagnetic layer provided on the first pinned ferromagnetic layer, a second pinned ferromagnetic layer provided on the antiferromagnetic layer, a second nonmagnetic intermediate layer provided on the second pinned ferromagnetic layer, a second free ferromagnetic layer provided on the second nonmagnetic intermediate layer, and a second conductor layer provided on the second free intermediate layer.

Figure 10A:
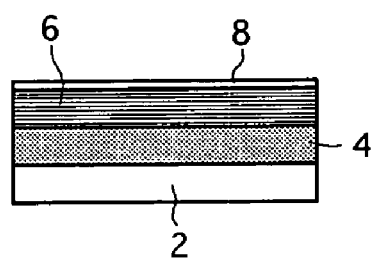
FIGS. 10A to 10P and FIGS. 10A' to 10P' are sectional views and plan views, respectively, showing a manufacturing process for the magnetoresistive sensor shown in FIG. 1.
Figure 10A:
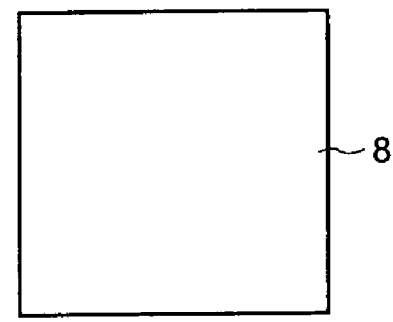

A manufacturing process for the magnetoresistive sensor of the present invention will now be described with reference to FIGS. 10A to 10P and FIGS. 10A' to 10P'. FIGS. 10A to 10P are sectional views, and FIGS. 10A' to 10P' are plan views.

As shown in FIG. 10A, a lower terminal layer 4 composed of a Cu film having a thickness of 400 nm and an Au film having a thickness of 100 nm is formed on an Al$_2$O$_3$—TiC substrate 2 by sputtering. Then, a spin valve GMR film 6 shown in any one of FIGS. 2 to 9 is formed on the lower terminal layer 4 by sputtering. Then, a cap layer 8 composed of a Cu film having a thickness of 10 nm and an Au film having a thickness of 10 nm is formed on the spin valve GMR film 6 by sputtering. After forming the cap layer 8, the laminate is subjected to heat treatment at 280° C. for 3 hours as applying a magnetic field of 100 oersteds (Oe).

Figure 10B:
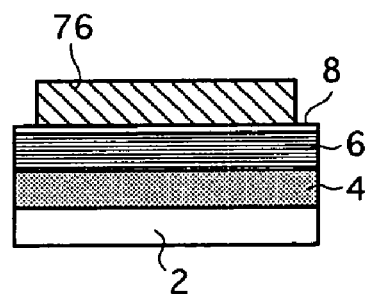
Figure 10B:
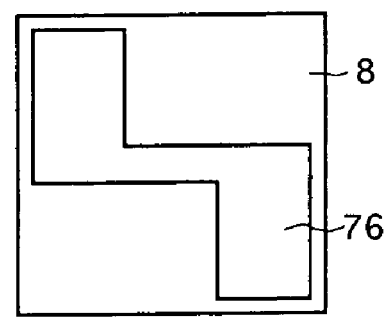
Figure 10C:
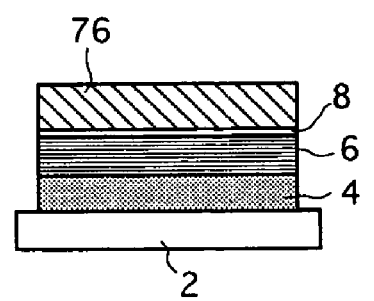
Figure 10C:
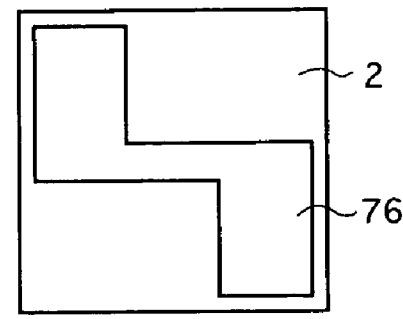
Figure 10D:
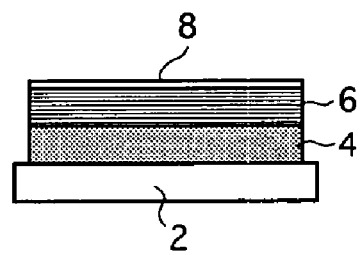
Figure 10D:
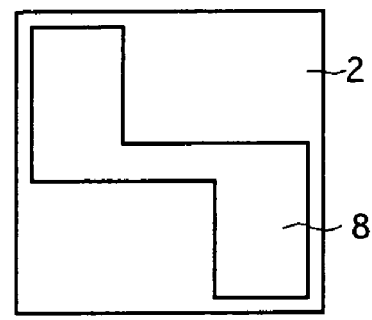
Figure 10E:
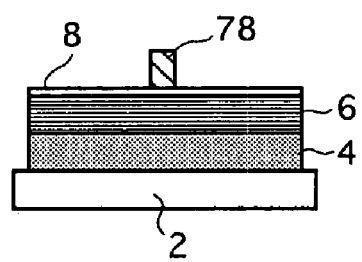
Figure 10E:
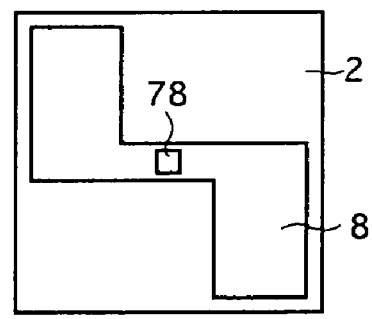
Figure 10F:
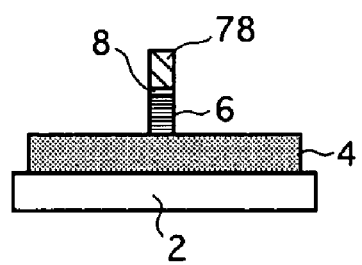
Figure 10F:
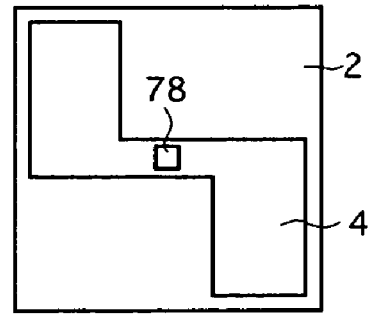
Figure 10G:
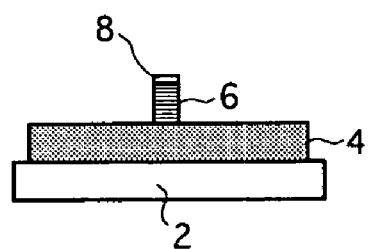
Figure 10G:
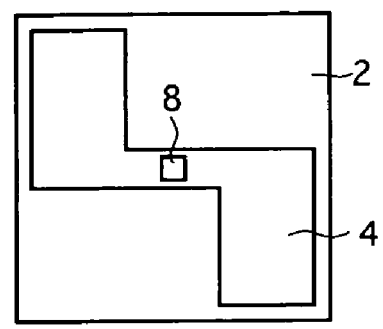

As shown in FIGS. 10B and 10B', a resist 76 having the same shape as the final shape of the lower terminal layer 4 is formed on the cap layer 8. As shown in FIGS. 10C and 10C', the laminate is subjected to ion milling with Ar ions to remove the layers 4, 6, and 8 except their portions under the resist 76. Then, the resist 76 is removed to obtain a condition shown in FIGS. 10D and 10D'. As shown in FIGS. 10E and 10E', a resist 78 is formed on the cap layer 8 at a position corresponding to a GMR portion. As shown in FIGS. 10F and 10F', the laminate is subjected to ion milling to remove the layers 8 and 6 except their portions under the resist 78. Then, the resist 78 is removed to obtain a condition shown in FIGS. 10G and 10G'.

Figure 10H:
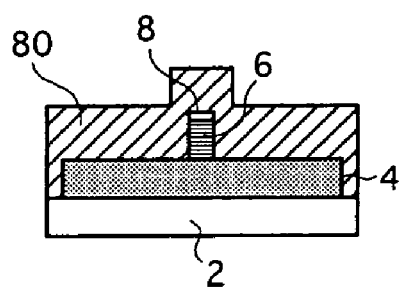
Figure 10H:
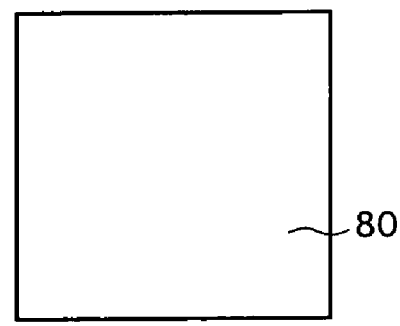
Figure 10I:
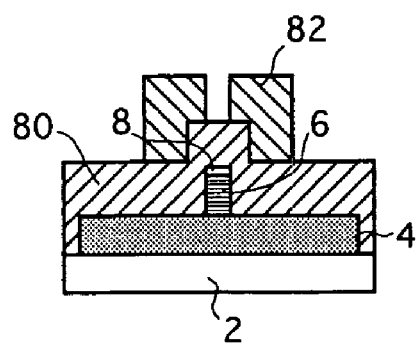
Figure 10I:
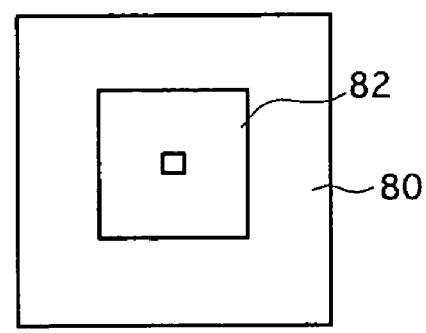
Figure 10J:
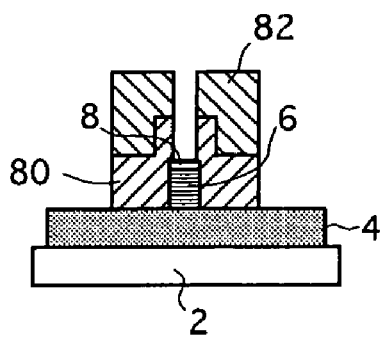
Figure 10J:
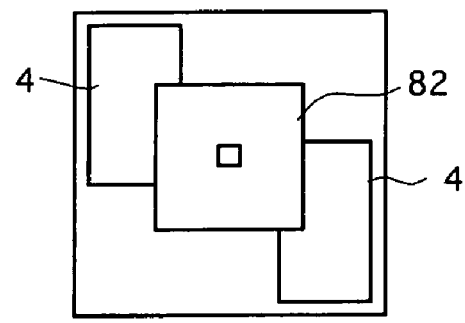
Figure 10K:
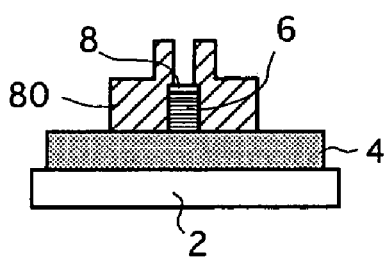
Figure 10K:
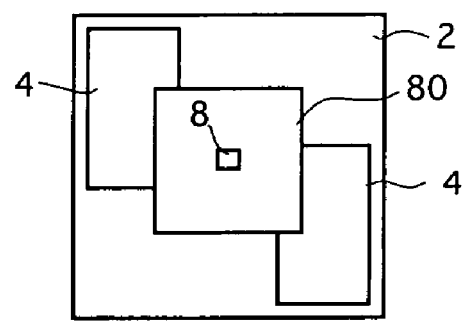

As shown in FIGS. 10H and 10H', an insulating layer 80 of $SiO_2$ having a thickness of 150 nm is formed over the substrate 2 so as to fully cover the layers 4, 6, and 8. As shown in FIGS. 10I and 10I', a resist 82 having the same shape as the final shape of the insulating layer 80 is formed on the insulating layer 80. As shown in FIGS. 10J and 10J', the laminate is subjected to reactive ion etching (RIE) to remove the insulating layer 80 except its portion under the resist 82. Then, the resist 82 is removed to obtain a condition shown in FIGS. 10K and 10K'.

Figure 10L:
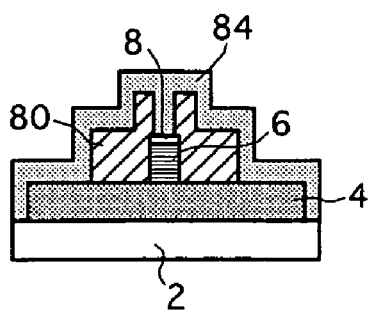
Figure 10L:
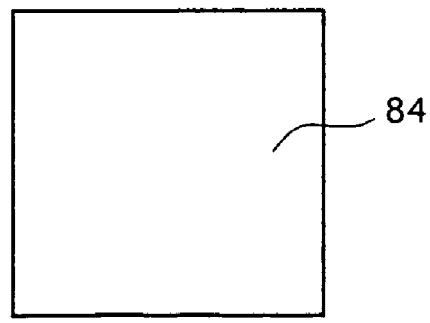
Figure 10M:
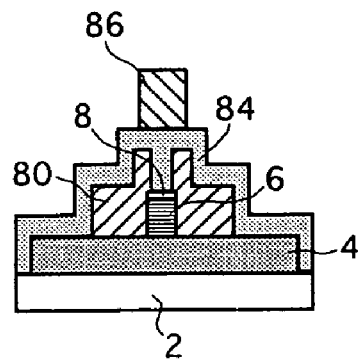
Figure 10M:
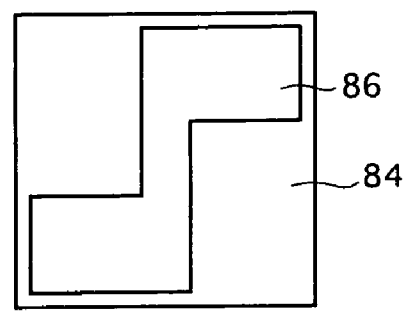
Figure 10N:
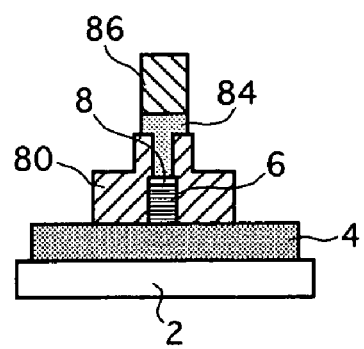
Figure 10N:
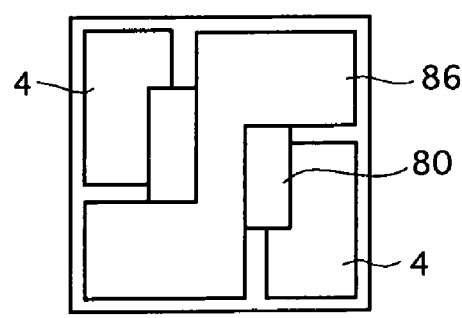
Figure 10P:
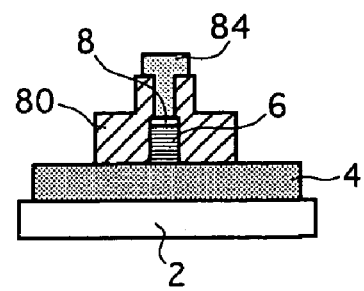
Figure 10P:
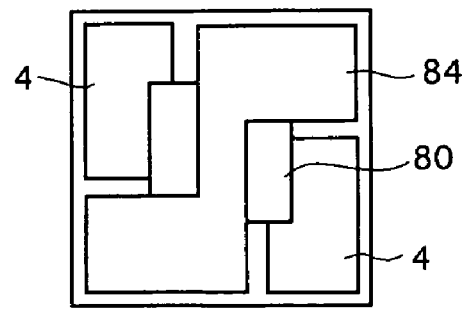

As shown in FIGS. 10L and 10L', an upper terminal layer 84 of Cu having a thickness of 300 nm is formed over the substrate 2 so as to fully cover the layers 4, 8, and 80. As shown in FIGS. 10M and 10M', a resist 86 having the same shape as the final shape of the upper terminal layer 84 is formed on the upper terminal layer 84. As shown in FIGS. 10N and 10N', the laminate is subjected to RIE to remove the layer 84 except its portion under the resist 86. Then, the resist 86 is removed to obtain a condition shown in FIGS. 10P and 10P', thus completing a CPP spin valve magnetoresistive sensor.

Figure 11:
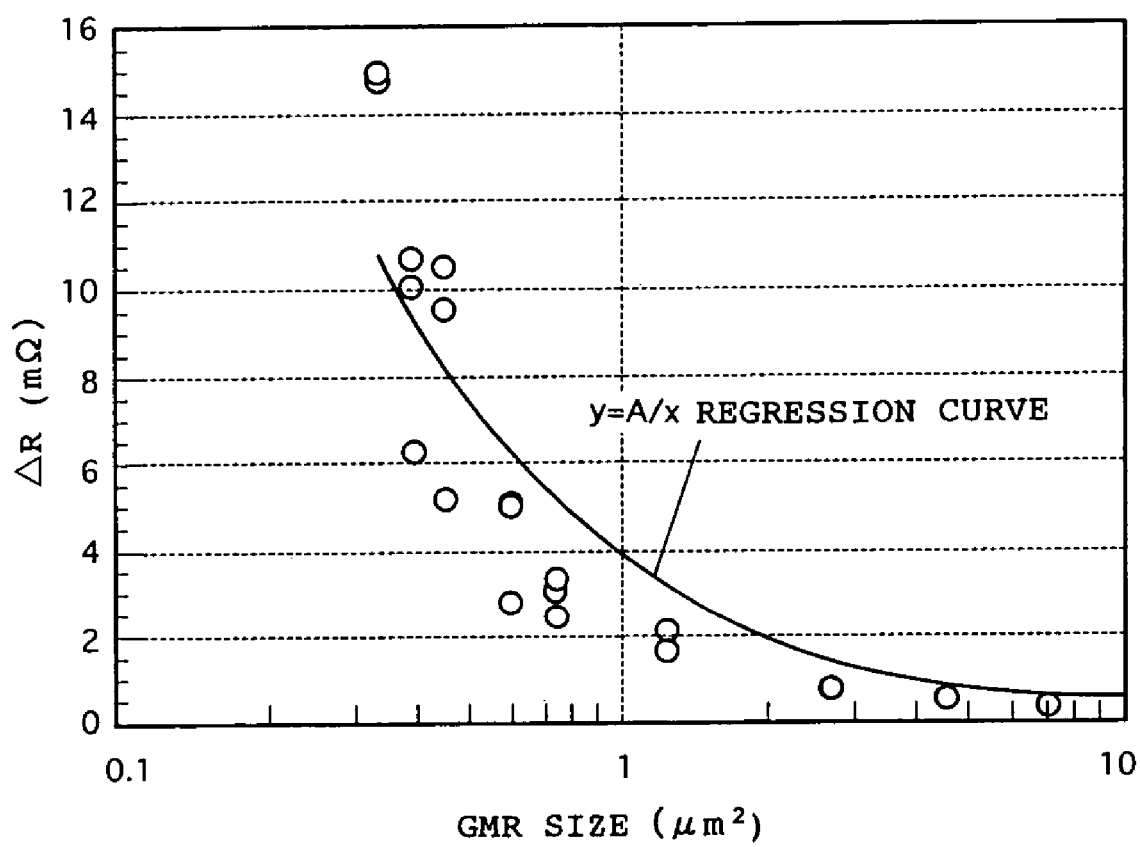
FIG. 11 is a graph showing a resistance change amount ΔR according to a GMR size.

The CPP spin valve magnetoresistive sensor thus prepared was subjected to resistance measurement by a four-terminal method as applying a magnetic field of ±500 oersteds (Oe). FIG. 11 shows a change in resistance change amount $\Delta R$ (m$\Omega$) according to GMR element size (area, $\mu m^2$) for the sample (f) shown in FIG. 7 in the case that the thickness of the CoFeB free layer 34 is set to 7 nm. Measured data of the resistance change amount are approximated to a regression curve, y=A/x to calculate $\Delta R$ for 1 $\mu m^2$ and obtain 3.8 m$\Omega\mu m^2$.

Figure 12:
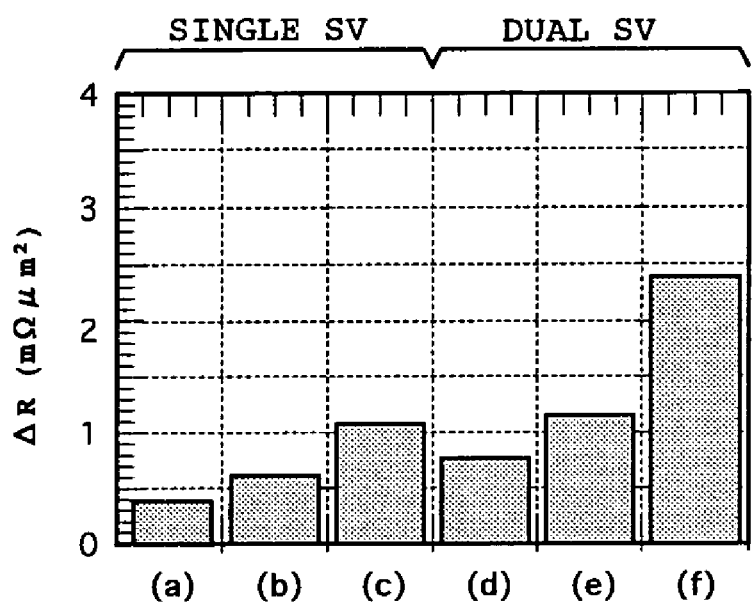
FIG. 12 is a graph showing resistance change amounts ΔR in the samples (a) to (f)
Figure 13:
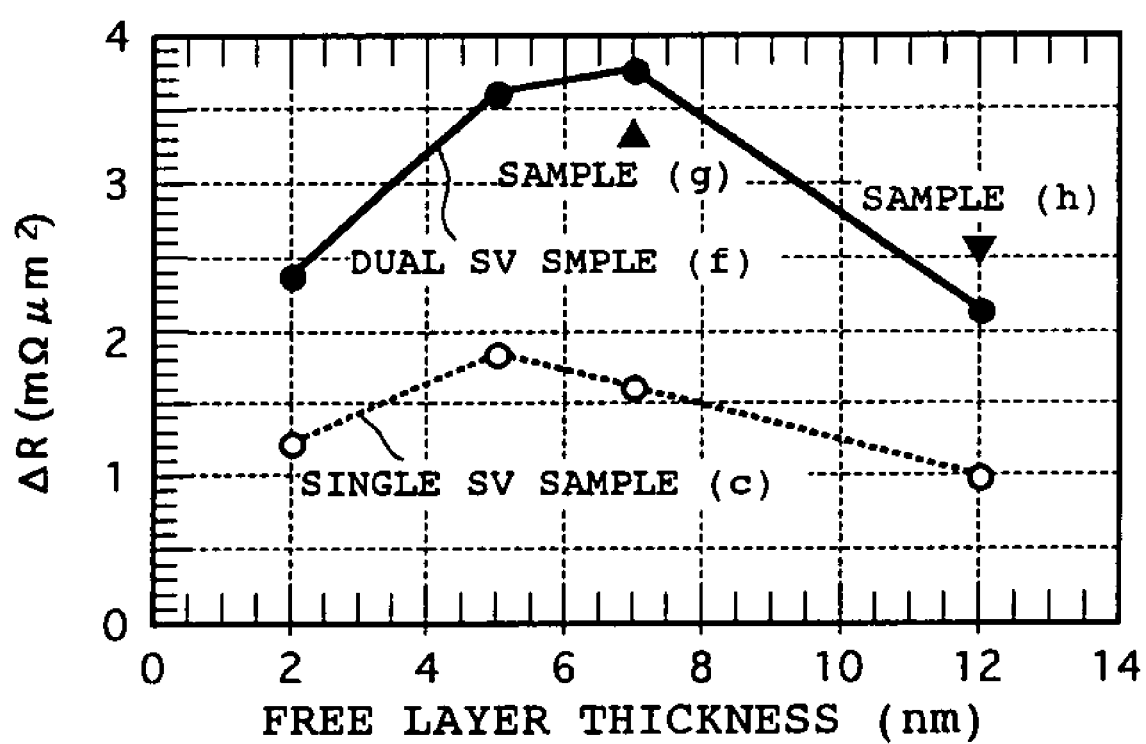
FIG. 13 is a graph showing a resistance change amount ΔR according to the thickness of a free layer.

For all the samples (a) to (h), $\Delta R$ for 1 $\mu m^2$ was measured, and the results are shown in FIGS. 12 and 13. In FIG. 12, the results for the samples (c) and (f) correspond to the resistance change amounts $\Delta R$ in the case that the thickness of each free layer is set to 2 nm. In the single spin valve GMR films, $\Delta R$ for 1 $\mu m^2$ in the sample (b) having a laminated ferri pinned layer is about 1.5 times that in the sample (a). Further, $\Delta R$ for 1 $\mu m^2$ in the sample (c) having a pinned layer and an intermediate layer both increased in thickness is about 2 times that in the sample (b).

In the dual spin valve GMR films, $\Delta R$ for 1 $\mu m^2$ in the sample (d) formed as a dual spin valve from the sample (a) is about 2 times that in the sample (a). Further, $\Delta R$ for 1 $\mu m^2$ in the sample (e) prepared by forming each pinned layer in the sample (d) into a laminated ferri structure is larger than that in the sample (d). Further, $\Delta R$ for 1 $\mu m^2$ in the sample (f) prepared by increasing the thicknesses of each laminated ferri pinned layer and each intermediate layer in the sample (e) is larger than that in the sample (e). In each of the samples (c) and (f), the thickness of the free layer was changed to measure the resistance change amount $\Delta R$ for 1 $\mu m^2$. The results of measurement are shown in FIG. 13. As apparent from FIG. 13, $\Delta R$ for 1 $\mu m^2$ becomes a maximum value when the thickness of the free layer in the sample (c) of the single spin valve is 5 nm, whereas when the thickness of the free layer in the sample (f) of the dual spin valve is 7 nm. Also in the samples (g) and (h) each prepared by largely changing the configuration of the free layer from that of the sample (f), as large values for $\Delta R$ as 3.4 m$\Omega\mu m^2$ and 2.8 m$\Omega\mu m^2$ are obtained, respectively.

The following conclusion may be derived from the above experimental results. In the case that the spin valve GMR film is used with a CPP structure, the resistance change amount $\Delta R$ can be improved by adopting a dual spin valve, forming a laminated ferri structure, or increasing the thickness of at least one of the pinned layer, the intermediate layer, and the free layer. While adopting a dual spin valve, forming a laminated ferri structure, or increasing the thickness of at least one of the pinned layer, the intermediate layer, and the free layer is effective solely in improving the resistance change amount $\Delta R$, the combination of these measures may further improve the resistance change amount $\Delta R$.

While there is not specifically shown any samples in which the thickness of at least one of the pinned layer and the intermediate layer is increased without forming a laminated ferri structure, it was confirmed that these samples can also improve $\Delta R$. By increasing the thickness of the free layer or the pinned layer over the CIP optimum layer thickness, the resistance change amount $\Delta R$ can be improved. More specifically, the thickness of the free layer or the pinned layer is preferably in the range of 3 nm to 12 nm, more preferably in the range of 5 nm to 7 nm. This optimum layer thickness is equal to the mean free path of electrons not spin-dependently scattering in CoFeB as the magnetic material for the free layer and the pinned layer. Even when the material for the free layer and the pinned layer is changed, the optimum thickness of the free layer or the pinned layer is equal to the mean free path of electrons not spin-dependently scattering in this material.

In setting the thickness of the Cu intermediate layer, it is necessary to sufficiently cut the interlayer bonding between the magnetic layers in the case that the thickness of the pinned layer or the free layer is increased. While the thickness of the intermediate layer is about 2.8 nm in the case of the CIP optimum layer thickness, the thickness of the intermediate layer must be set larger in the case that the thickness of the pinned layer or the free layer is increased. Preferably, the thickness of the intermediate layer is in the range of 4 nm to 6 nm to sufficiently cut the interlayer bonding between the magnetic layers. The above-mentioned CPP spin valve magnetoresistive sensor is used mainly as a magnetoresistive head for a magnetic disk drive as a recording/reproducing device for a computer.

Figure 14A:
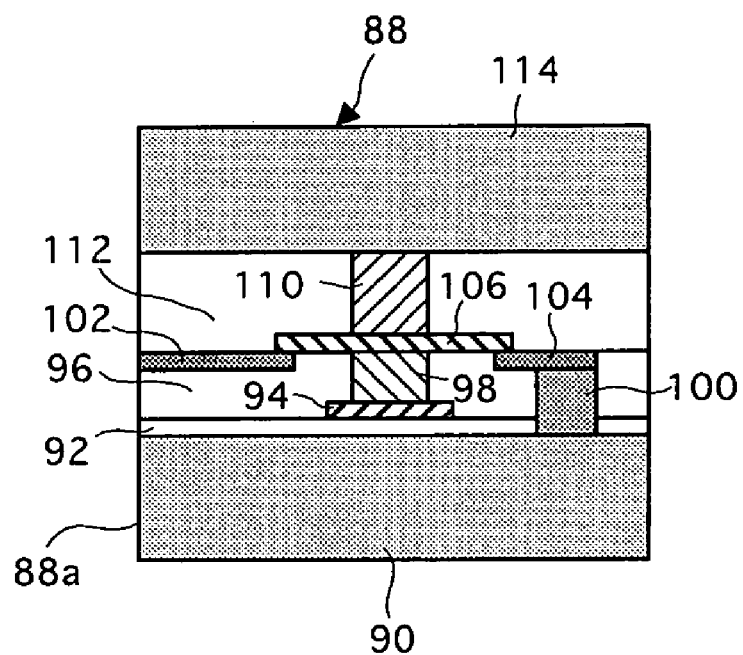
FIG. 14A is a sectional view of a spin valve magnetoresistive head according to a second preferred embodiment of the present invention.

Referring to FIG. 14A, there is shown a sectional view of a magnetoresistive head 88 according to a second preferred embodiment of the present invention. Reference numeral 90 denotes a first magnetic shield formed of NiFe, for example. An insulating layer 92 of alumina ($Al_2O_3$), for example, is formed on the first magnetic shield 90. Reference numerals 96 and 112 denote insulating layers formed of alumina, for example. Lower electrode terminals 94 and 98 are formed on the insulating layer 92 by plating or vapor deposition. Reference numeral 106 denotes a spin valve magnetoresistive element selected from a spin valve GMR film of NiFe/Cu/NiFe/IrMn, for example, a laminated ferri spin valve GMR film of NiFe/Cu/CoFeB/Ru/CoFeB/PdPtMn, for example, and a tunnel junction type MR film (TMR film) of NiFe/$Al_2O_3$/NiFe/PdPtMn, for example.

Reference numeral 102 denotes a first flux guide formed of NiFe, for example. The first flux guide 102 has one end exposed to a medium opposing surface 88a of the head 88 and another end overlapping one end of the spin valve magnetoresistive element 106. While the first flux guide 102 is preferably in contact with the spin valve magnetoresistive element 106, the electrical contact therebetween is not essential provided that they are positioned in proximity to each other so as to ensure magnetic bonding. Reference numeral 104 denotes a second flux guide formed of NiFe, for example. The second flux guide 104 has one end overlapping the other end of the spin valve magnetoresistive element 106. While the second flux guide 104 is preferably in contact with the spin valve magnetoresistive element 106, the electrical contact therebetween is not essential provided that they are positioned in proximity to each other so as to ensure magnetic bonding.

A flux path 100 of NiFe, for example, is formed between the first magnetic shield 90 and the second flux guide 104. While the flux path 100 is preferably in contact with the first magnetic shield 90 and the second flux guide 104, the electrical contact between the flux path 100 and the first magnetic shield 90 and the electrical contact between the flux path 100 and the second flux guide 104 are not essential provided that the members 100 and 90 are positioned in proximity to each other and the members 100 and 104 are positioned in proximity to each other so as to ensure magnetic bonding. An upper electrode terminal 110 is formed on the spin valve magnetoresistive element 106. A second magnetic shield 114 of NiFe, for example, is formed so as to make an electrical contact with the upper electrode terminal 110, so that the second magnetic shield 114 functions as an electrode terminal.

Figure 14B:
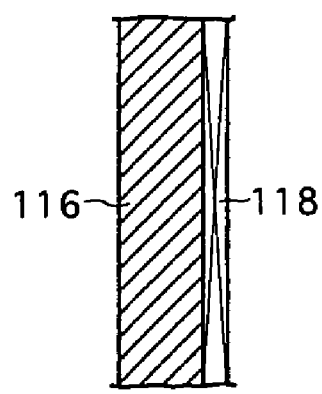
FIG. 14B is a sectional view of a magnetic recording medium.

In the magnetoresistive head 88 according to this preferred embodiment, the lower electrodes 94 and 98 are provided below the spin valve magnetoresistive element 106, and the upper electrode 110 is provided above the spin valve magnetoresistive element 106. Accordingly, the magnetoresistive head 88 has a CPP structure such that a current is passed in a direction perpendicular to the film surface of the spin valve magnetoresistive element 106. FIG. 14B shows a magnetic recording medium 116 having a recording track 118. In the spin valve magnetoresistive head 88, a signal magnetic field leaked from the magnetic recording medium 116 is guided through the first flux guide 102 to the spin valve magnetoresistive element 106. The signal magnetic field from the spin valve magnetoresistive element 106 is further guided through the second flux guide 104 and the flux path 100 to the first magnetic shield 90.

Each of the electrode terminals 98 and 110 is in contact with a part of the film surface of the spin valve magnetoresistive element 106, and has a size smaller than the spin valve magnetoresistive element 106 in this film surface. Accordingly, the motion of magnetization only at a central portion of the spin valve magnetoresistive element 106 where the sensitivity is highest can be detected by the electrode terminals 98 and 110, thereby obtaining high-sensitivity reproduction characteristics of the head 88. Further, the head 88 has a flux guide type structure, so that it is not necessary to directly polish the spin valve magnetoresistive element 106. Accordingly, spin valve magnetoresistive heads can be produced at high yield.

A manufacturing method for the spin valve magnetoresistive head 88 will now be described with reference to FIGS. 15A to 15J and FIGS. 15A' to 15J'. FIGS. 15A to 15J are sectional views taken in the longitudinal direction of the recording track 118, and FIGS. 15A' to 15J' are sectional views taken along the width of the recording track 118.

Figure 15A:
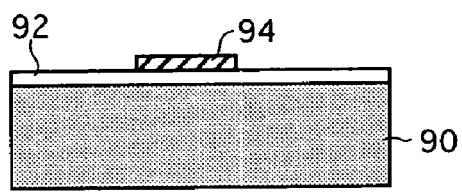
FIGS. 15A to 15J and FIGS. 15A' to 15J' are sectional views taken in the longitudinal direction of a recording track and sectional views taken along the width of the recording track, respectively, showing a manufacturing process for the spin valve magnetoresistive head shown in FIG. 14A.
Figure 15A:
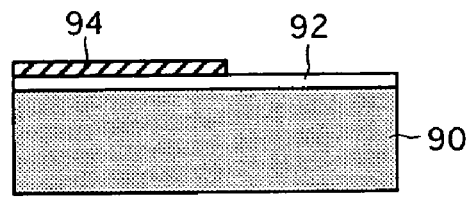
Figure 15B:
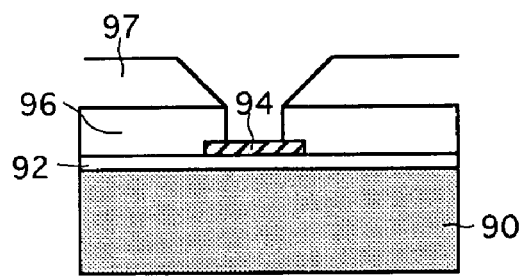
Figure 15B:
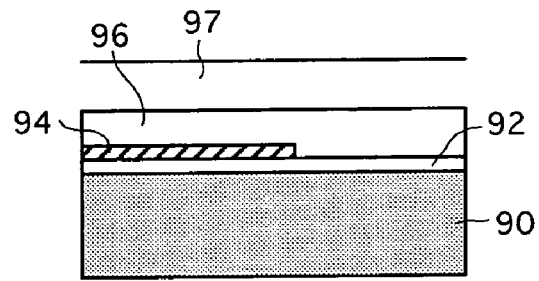

First, a first magnetic shield 90, an insulating layer 92, and an electrode terminal 94 are sequentially formed on a substrate (not shown). As shown in FIGS. 15A and 15A', the electrode terminal 94 is patterned to a desired shape. Then, an insulating layer 96 is formed so as to cover the electrode terminal 94, and a resist 97 is formed on the insulating layer 96. The resist 97 is then patterned to a desired shape. As shown in FIGS. 15B and 15B', a hole is opened through the insulating layer 96 by ion milling or the like by using the resist 97 as a mask.

Figure 15C:
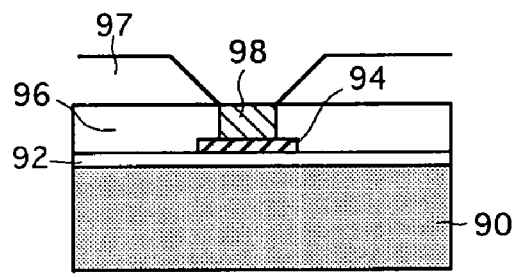
Figure 15C:
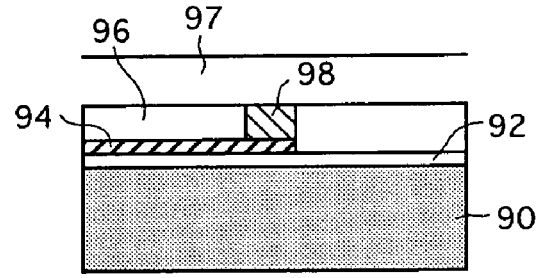
Figure 15D:
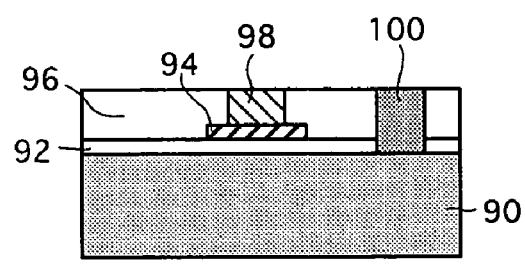
Figure 15D:
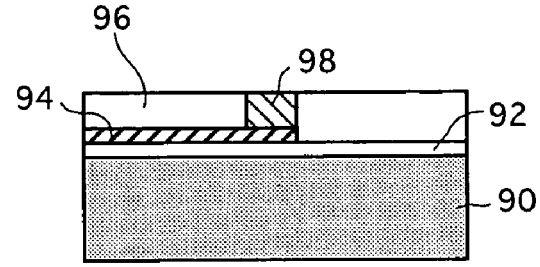

As shown in FIGS. 15C and 15C', an electrode terminal 98 is formed on the electrode terminal 94 exposed to the hole of the insulating layer 96 with the resist 97 not removed. In this condition, the electrode terminals 94 and 98 are in electrical contact with each other. As shown in FIG. 15D, a flux path 100 is formed by opening a hole through the insulating layers 92 and 96 in a manner similar to that of forming the electrode terminal 98. In this condition, the first magnetic shield 90 and the flux path 100 are preferably in contact with each other. However, the electrical contact therebetween is not essential provided that they are positioned in proximity to each other so as to ensure magnetic bonding.

Figure 15E:
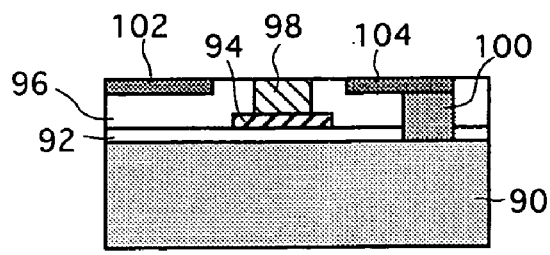
Figure 15E:
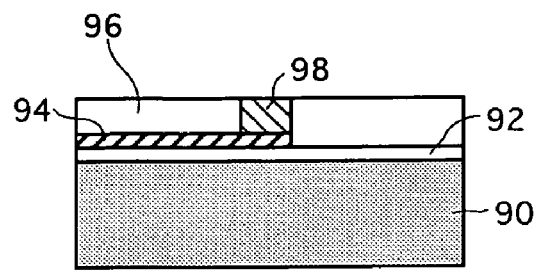

As shown in FIG. 15E, a first flux guide 102 and a second flux guide 104 are formed by opening holes in the insulating layer 96 in a manner similar to that of forming the electrode terminal 98. The first flux guide 102 is formed preferably not in electrical contact with the electrode terminals 94 and 98 and the first magnetic shield 90. The second flux guide 104 is also formed preferably not in electrical contact with the electrode terminals 94 and 98 and the first magnetic shield 90. The second flux guide 104 is preferably in contact with the flux path 100. However, the electrical contact between the second flux guide 104 and the flux path 100 is not essential provided that they are positioned in proximity to each other so as to ensure magnetic bonding.

Figure 15F:
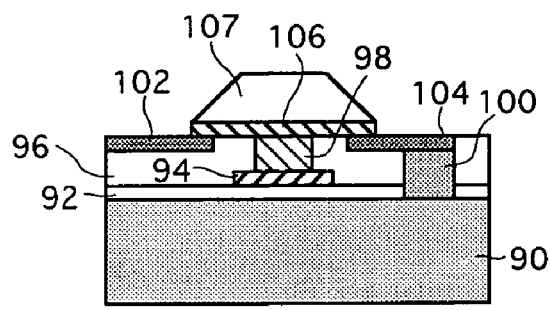
Figure 15F:
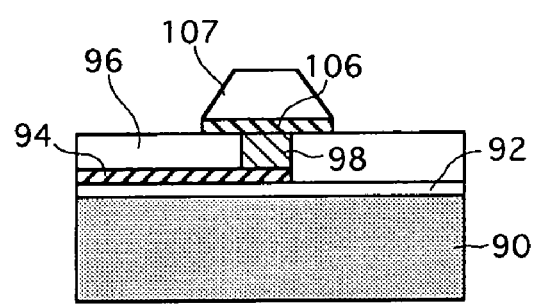
Figure 15G:
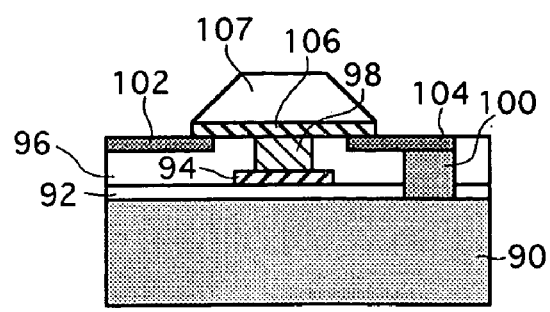
Figure 15G:
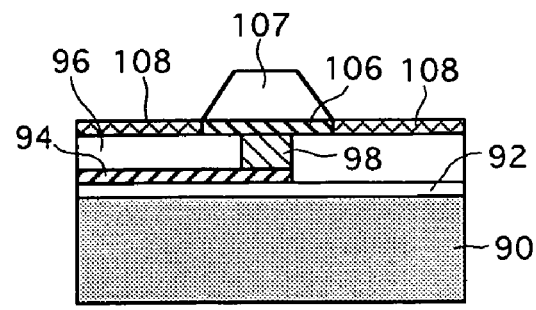

Then, a GMR film 106 as the spin valve magnetoresistive element is formed by sputtering so as to cover the electrode terminal 98 and the flux guides 102 and 104. A resist 107 is then formed on the GMR film 106 and patterned to a desired shape. As shown in FIGS. 15F and 15F', the spin valve magnetoresistive element 106 is patterned to a desired shape by using the resist 107 as a mask. In this condition, the spin valve magnetoresistive element 106 and the flux guides 102 and 104 are positioned so as to overlap each other at a part of the film surface of the spin valve magnetoresistive element 106. The spin valve magnetoresistive element 106 and the flux guides 102 and 104 are preferably in contact with each other. However, the electrical contact therebetween is not essential provided that they are positioned in proximity to each other so as to ensure magnetic bonding.

Figure 15H:
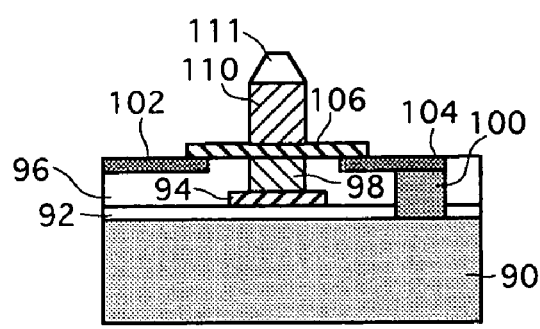
Figure 15H:
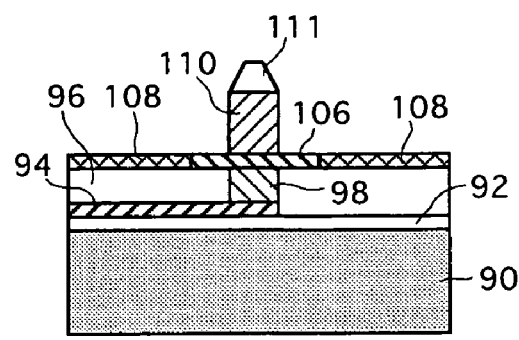

As shown in FIG. 15C', magnetic domain control film 108 are formed on the opposite sides of the spin valve magnetoresistive element 106 by sputtering with the resist 107 not removed. Each magnetic domain control film 108 may be selected from a high-coercivity film of CoCrPt, for example, and an antiferromagnetic film of PdPtMn, for example. After removing the resist 107, an electrode terminal 110 is formed over the laminate. Then, a resist 111 is formed on the electrode terminal 110 and patterned to a desired shape. As shown in FIGS. 15H and 15H', the electrode terminal 110 is patterned by using the resist 111 as a mask.

Figure 15I:
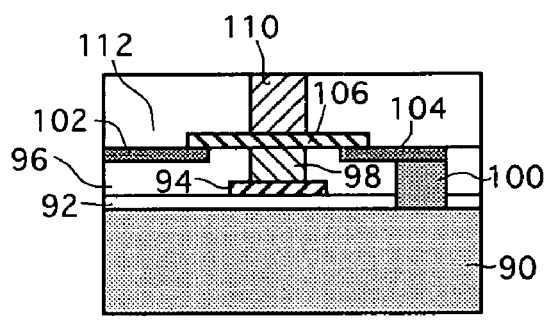
Figure 15I:
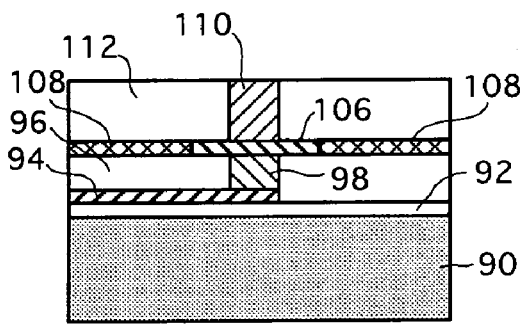
Figure 15J:
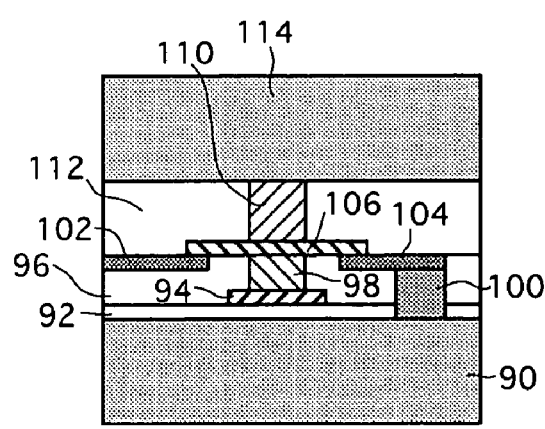
Figure 15J:
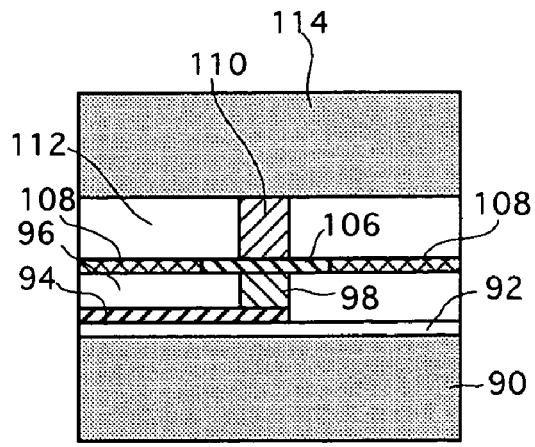

Then, an insulating layer 112 is formed over the laminate with the resist 111 not removed. After removing the resist 111 as shown in FIGS. 15I and 15I', a second magnetic shield 114 is formed on the insulating layer 112 to obtain a condition shown in FIGS. 15J and 15J', thus completing the spin valve magnetoresistive head 88. In this condition, the electrode terminal 110 and the second magnetic shield 114 are in electrical contact with each other. The first and second magnetic shields 90 and 114 and the electrode terminal 110 are formed by plating or vapor deposition. The insulating layers 92, 96, and 111 are formed by sputtering or the like. By the above manufacturing method, it is possible to obtain a flux guide type spin valve magnetoresistive head having a CPP structure which can achieve a high sensitivity.

Figure 16A:
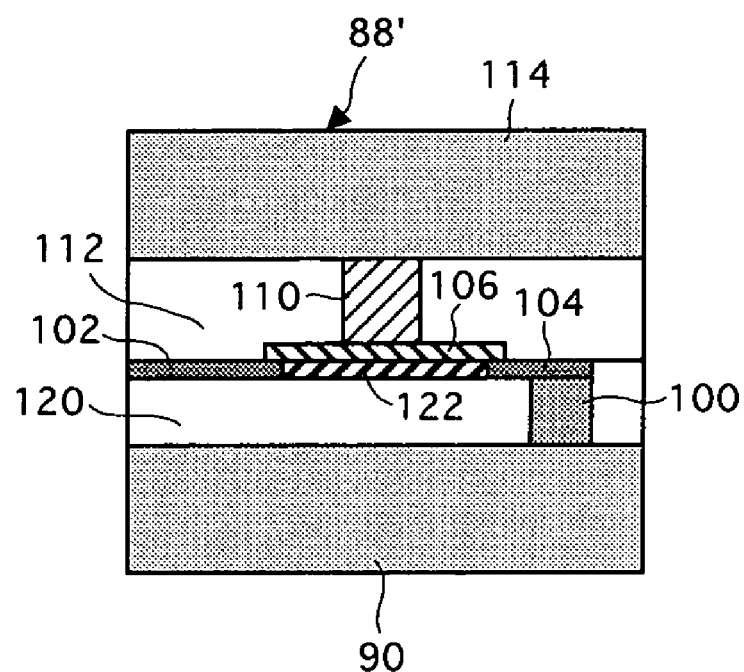
FIG. 16A is a sectional view of a spin valve magnetoresistive head according to a third preferred embodiment of the present invention.

Referring to FIG. 16A, there is shown a sectional view of a spin valve magnetoresistive head 88' according to a third preferred embodiment of the present invention. In contrast with the spin valve magnetoresistive head 88 according to the second preferred embodiment shown in FIG. 14A, the spin valve magnetoresistive head 88' is characterized in that it does not include the electrodes 94 and 98 of the head 88. In the spin valve magnetoresistive head 88' according to the third preferred embodiment, the spin valve magnetoresistive element 106 is in contact with the second flux guide 104, and the flux path 100 is in contact with the second flux guide 104 and the first magnetic shield 90.

Figure 16B:
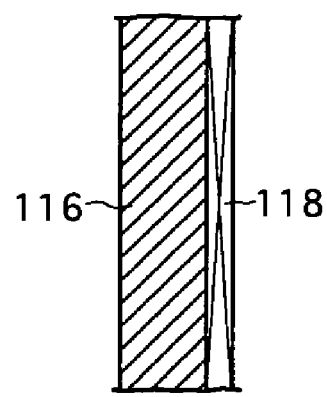
FIG. 16B is a sectional view of a magnetic recording medium.

Accordingly, the first magnetic shield 90 and the spin valve magnetoresistive element 106 are electrically connected through the flux path 100 and the second flux guide 104. In the spin valve magnetoresistive head 88' according to this preferred embodiment, the first magnetic shield 90 functions as a lower electrode terminal, and the second magnetic shield 114 functions as an upper electrode terminal. Further, a nonmagnetic film 122 of Cu, $Al_2O_3$, or the like is formed between the first flux guide 102 and the second flux guide 104. Reference numeral 120 denotes an insulating layer. FIG. 16B shows a magnetic recording medium 116 having a recording track 118.

A manufacturing method for the spin valve magnetoresistive head 88, will now be described with reference to FIGS. 17A to 17H and FIGS. 17A' to 17H'. FIGS. 17A to 17H are sectional views taken in the longitudinal direction of the recording track 118, and FIGS. 17A' to 17H' are sectional views taken along the width of the recording track 118.

Figure 17A:
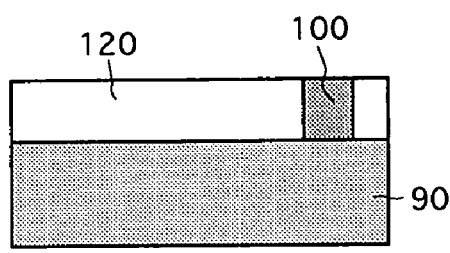
FIGS. 17A to 17H and FIGS. 17A' to 17H' are sectional views taken in the longitudinal direction of a recording track and sectional views taken along the width of the recording track, respectively, showing a manufacturing process for the spin valve magnetoresistive head shown in FIG. 16A.
Figure 17A:
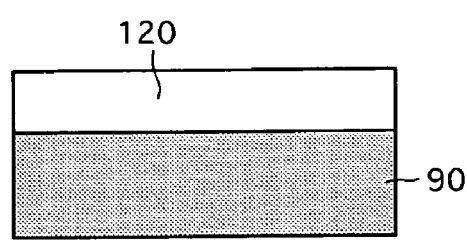
Figure 17B:
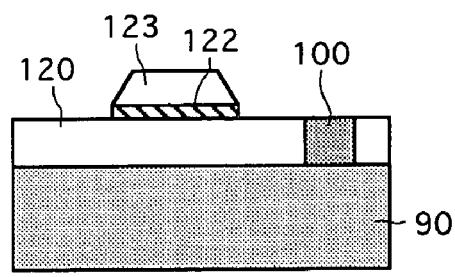
Figure 17B:
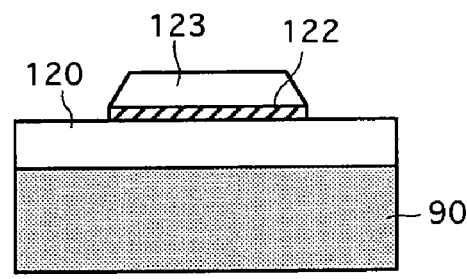

First, a first magnetic shield 90 and an insulating layer 120 are sequentially formed on a substrate (not shown). As shown in FIG. 17A, a flux path 100 is formed by opening a hole through the insulating layer 120. In this condition, the first magnetic shield 90 and the flux path 100 are in contact with each other and electrically connected together. Then, a nonmagnetic film 122 is formed over the laminate, and a resist 123 is next formed on the nonmagnetic film 122. Then, the resist 123 is patterned to a desired shape. As shown in FIGS. 17B and 17B', the nonmagnetic film 122 is patterned to a desired shape by using the resist 123 as a mask. The nonmagnetic film 122 may be formed of Cu, $Al_2O_3$, or the like.

Figure 17C:
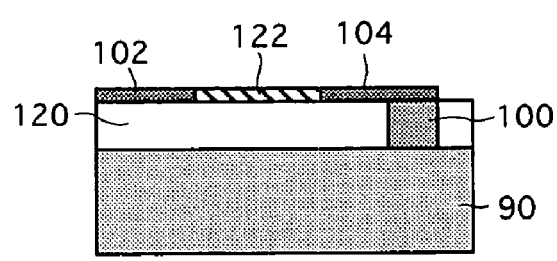
Figure 17C:
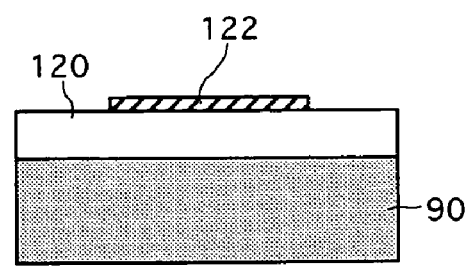

A first flux guide 102 and a second flux guide 104 are formed over the laminate with the resist 123 not removed. After removing the resist 123, the first flux guide 102 and the second flux guide 104 are patterned to a desired shape as shown in FIGS. 17C and 17C'. In this condition, the second flux guide 104 is in contact with the flux path 100 to provide electrical connection therebetween. Then, a spin valve GMR film 106 as the spin valve magnetoresistive element is formed over the laminate by sputtering or the like, and a resist 107 is next formed on the GMR film 106. The resist 107 is next patterned to a desired shape.

Figure 17D:
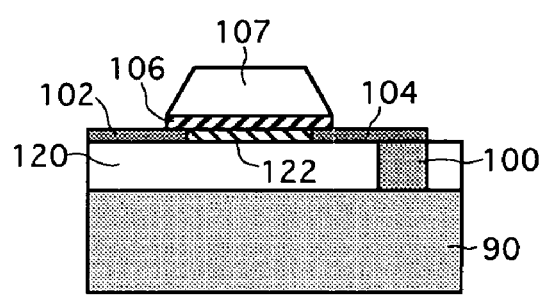
Figure 17D:
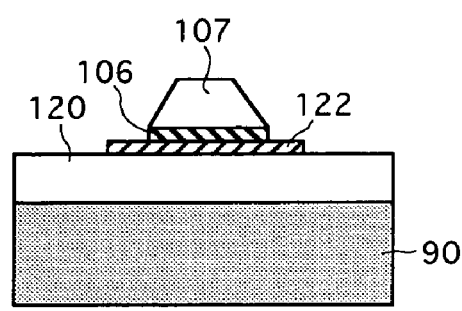
Figure 17E:
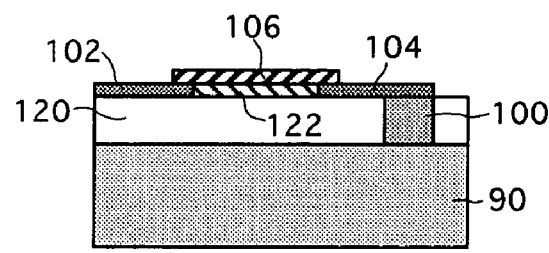
Figure 17E:
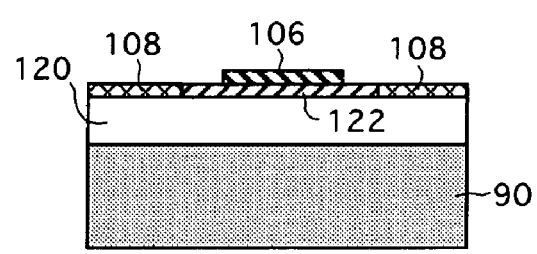

As shown in FIGS. 17D and 17D', the GMR film 106 is patterned to a desired shape by using the resist 107 as a mask. In this condition, the spin valve magnetoresistive element (GMR film) 106 is positioned so as to overlap the first and second flux guides 102 and 104 at a part of the film surface of the spin valve magnetoresistive element 106. The spin valve magnetoresistive element 106 is preferably in contact with the first flux guide 102. However, the electrical contact therebetween is not essential provided that they are positioned in proximity to each other so as to ensure magnetic bonding. The spin valve magnetoresistive element 106 is in contact with the second flux guide 104 to provide electrical connection therebetween.

Figure 17F:
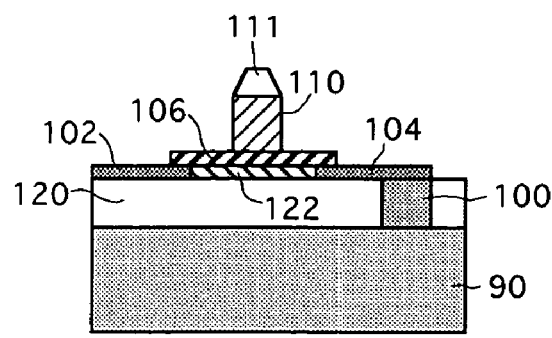
Figure 17F:
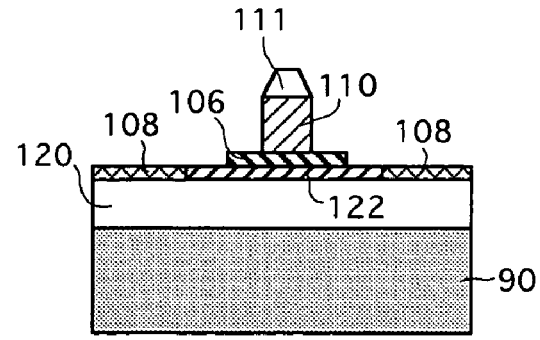
Figure 17G:
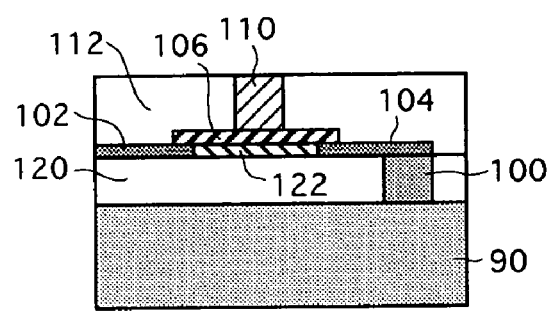
Figure 17G:
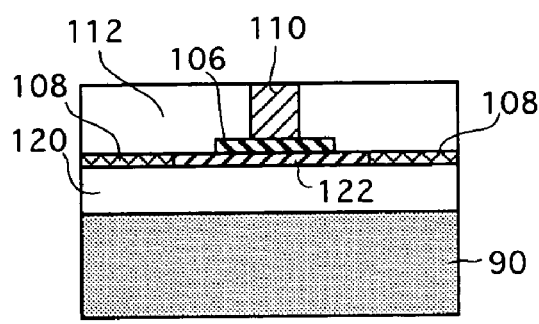

Then, magnetic domain control films 108 are formed over the laminate by sputtering or the like with the resist 107 not removed. After removing the resist 107, a condition shown in FIG. 17E' is obtained in which the magnetic domain control films 108 are formed on the opposite sides of the spin valve magnetoresistive element 106. Each magnetic domain control film 108 may be selected from a high-coercivity film of CoCrPt, for example, and an antiferromagnetic layer of PdPtMn, for example. Then, an electrode terminal 110 is formed over the laminate, and a resist 111 is next formed on the electrode terminal 110. The resist 111 is next patterned to a desired shape. As shown in FIGS. 17F and 17F', the electrode terminal 110 is patterned to a desired shape by using the resist 111 as a mask.

Figure 17H:
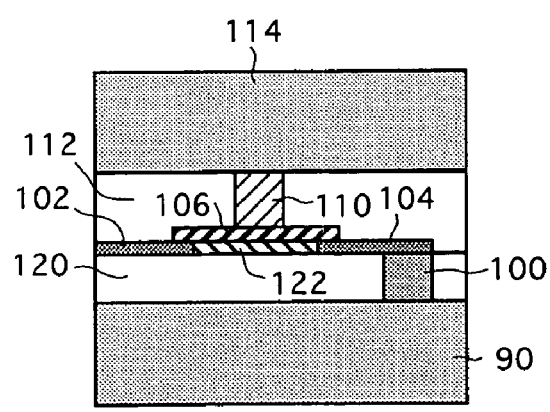
Figure 17H:
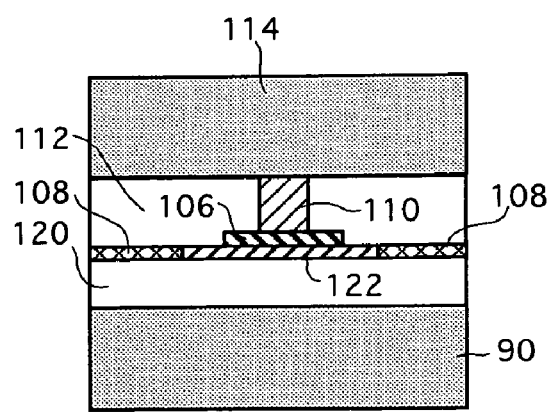

Then, an insulating layer 112 is formed over the laminate with the resist 111 not removed. After removing the resist 111, a condition shown in FIGS. 17G and 17G' is obtained. As shown in FIGS. 17H and 17H', a second magnetic shield 114 is formed on the insulating layer 112 to complete the spin valve magnetoresistive head 88'. In this condition, the electrode terminal 110 and the second magnetic shield 114 are in contact with each other to provide electrical connection therebetween. In the spin valve magnetoresistive head 88' according to this preferred embodiment, the first magnetic shield 90 serves also as a lower electrode terminal to provide a CPP structure.

Figure 18:
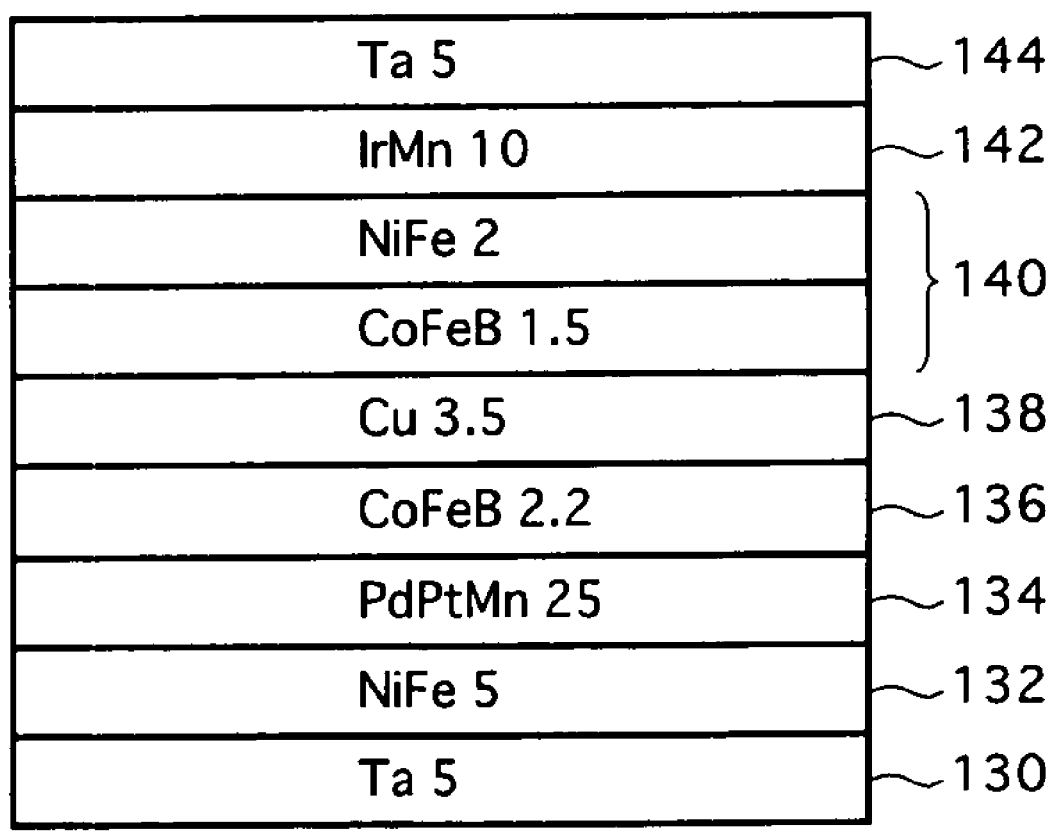
FIG. 18 is a schematic illustration of the configuration of a reverse laminated type spin valve GMR film.

Referring to FIG. 18, there is shown a film configuration of a reverse laminated type spin valve GMR film as the spin valve magnetoresistive element. A Ta under layer 130 having a thickness of 5 nm is formed on an Si substrate (not shown). A NiFe buffer layer 132 having a thickness of 5 nm is formed on the Ta under layer 130. A PdPtMn antiferromagnetic layer 134 having a thickness of 25 nm is formed on the NiFe buffer layer 132. A CoFeB pinned layer 136 having a thickness of 2.2 nm is formed on the PdPtMn antiferromagnetic layer 134. These layers 130 to 136 are formed by DC magnetron sputtering. A Cu intermediate layer 138 having a thickness of 3.5 nm is formed on the pinned layer 136. A CoFeB layer having a thickness of 1.5 nm is formed on the Cu intermediate layer 138, and a NiFe layer having a thickness of 2 nm is formed on the CoFeB layer to form a free layer 140. An IrMn antiferromagnetic layer 142 having a thickness of 10 nm as a bias magnetic field applying layer to the free layer 140 is formed on the free layer 140. A Ta cap layer 144 having a thickness of 5 nm is formed on the antiferromagnetic layer 142.

This sample is subjected to heat treatment at 280° C. for 3 hours as applying a magnetic field of 2.5 kilo-oersteds (Oe) under a vacuum of $8 \times 10^{-5}$ pascals (Pa) or less, so as to order PdPtMn as an ordering antiferromagnetic material. Thereafter, this sample is subjected to RIE using an $SF_6$ gas. The conditions of this RIE are a process gas pressure of 0.5 Pa, a substrate temperature of 20° C., a substrate potential of 1 V, an antenna power of 100 W, and a bias power of 2 W. The Ta cap layer 144 is etched by the $SF_6$ gas.

Figure 19:
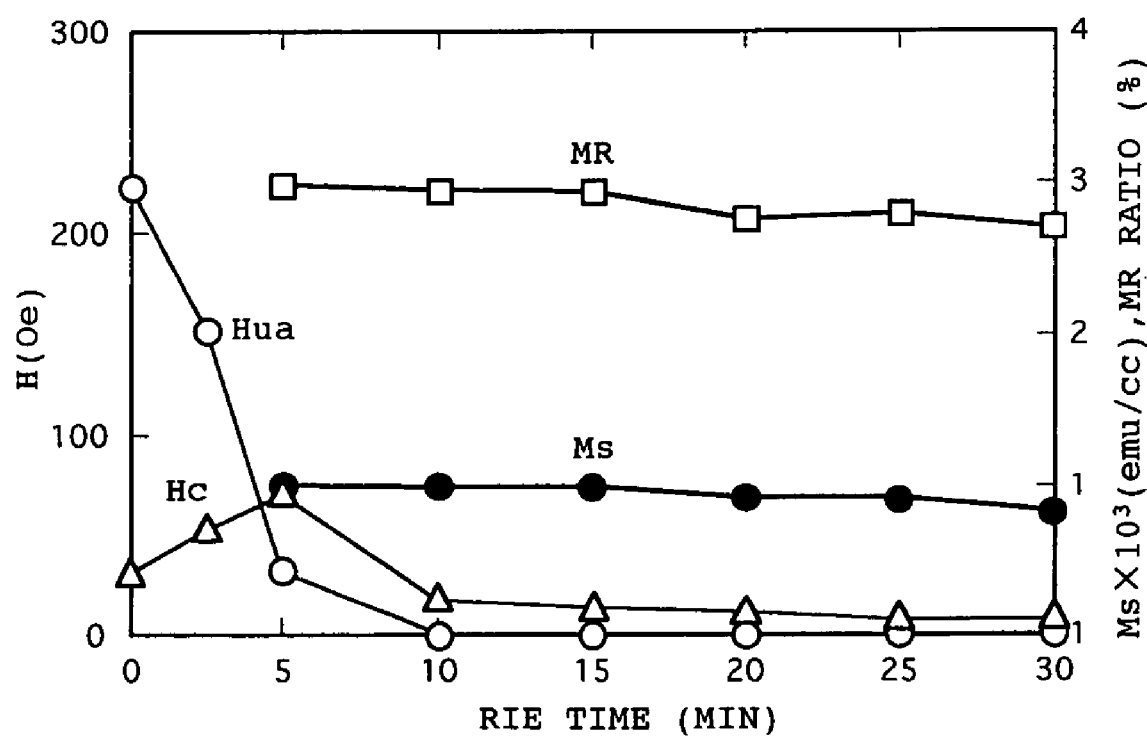
FIG. 19 is a graph showing the relation between RIE time and film characteristics when the spin valve GMR film shown in FIG. 18 is subjected to RIE using $SF_6$.

FIG. 19 shows the relation between RIE time by the SF6 gas and various characteristics of the spin valve GMR film. In FIG. 19, Hua is a bias magnetic field acting between the free layer 140 and the IrMn antiferromagnetic layer 142; Hc is a coercive force of the free layer 140; and Ms is a saturation magnetization of the free layer 140. As observed from FIG. 19, the bias magnetic field Hua between the free layer 140 and the IrMn bias magnetic field applying layer 142 disappears when the RIE time becomes 10 minutes. At this time, the coercive force Hc of the free layer 140 becomes about 8 oersteds (Oe), which is a value equal to that in the characteristics of the free layer as a single layer. On the other hand, the saturation magnetization Ms of the free layer 140 and the MR ratio of the spin valve GMR film are hardly changed. It is understood from the above results that an exchange bonding force between the IrMn antiferromagnetic layer (bias magnetic field applying layer) 142 and the free layer 140 can be eliminated with the characteristics of the spin valve GMR film being maintained in the case of using fluorine.

FIG. 20 shows the relation between peak intensities (contents) of F, Ir, and Mn and Hua acting on the free layer when the spin valve GMR film is subjected to RIE. As apparent from FIG. 20, the content of F in the GMR film increases with RIE time, which correlates with a decrease in Hua. On the other hand, the contents of Ir and Mn are hardly changed, which shows that IrMn is not physically etched, but remains still. The sample was subjected to RIE for 20 minutes and subsequently subjected to heat treatment at 280° C. As the result, the content of F was decreased as little as −8%, which shows that F has become a stable compound in the GMR film.

Figure 21:
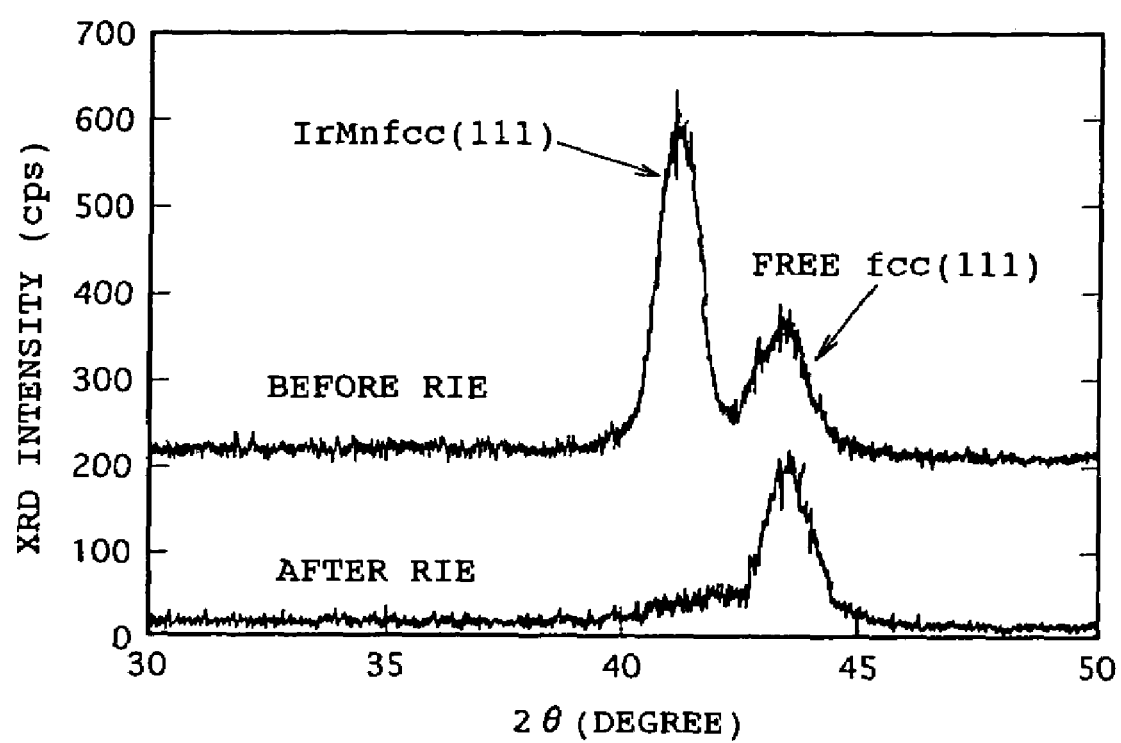
FIG. 21 is a graph showing X-ray diffraction characteristics of the spin valve GMR film before and after subjected to the RIE.

FIG. 21 shows X-ray diffraction characteristics of the spin valve GMR film before and after subjected to the RIE. As apparent from FIG. 21, the sample before subjected to the RIE shows a peak of fcc (111) of IrMn contributing to the appearance of Hua at an angle 2θ of about 41°. On the other hand, the sample after subjected to the RIE does not show this peak. This result is considered to be due to the fact that a fluoride is formed in the GMR film to cause a disturbance of crystallinity of IrMn and thereby eliminate Hua. Further, a peak of fcc (111) of the free layer 140 is observed at an angle 2θ of about 44° in both the samples before and after subjected to the RIE. This result shows that the exchange bonding force between the antiferromagnetic layer 142 and the free layer 140 can be eliminated without any adverse effects on the free layer 140 by performing the RIE under the above-mentioned conditions.

Also in PdPtMn as an antiferromagnetic material, it was confirmed that Hua can be eliminated by fluorine or chlorine. It can be easily analogized from this result that the exchange bonding force of the magnetic field sensing portion of the GMR film to any Mn-containing antiferromagnetic materials such as NiMn, PtMn, PdPtMn, and IrMn can be eliminated by fluorine or chlorine.

In the CPP spin valve magnetoresistive sensor according to the present invention, the thickness of the pinned ferromagnetic layer, the nonmagnetic intermediate layer, or the free ferromagnetic layer is increased to thereby obtain a large resistance change amount. Further, by applying a dual spin valve structure to the magnetoresistive sensor or by forming the pinned layer into a laminated ferri structure, a larger resistance change amount can be obtained. Also by forming the free layer into a laminated ferri structure, a similar effect can be obtained.

The spin valve magnetoresistive head according to the present invention has a flux guide structure and a CPP structure. Accordingly, the motion of magnetization only at the central portion of the spin valve magnetoresistive element where the sensitivity is highest can be detected by the electrode terminals, thereby obtaining high-sensitivity reproduction characteristics of the magnetoresistive head.

Further, owing to the flux guide structure, it is not necessary to directly polish the spin valve magnetoresistive element, thereby allowing high-yield production of spin valve magnetoresistive heads.

Further, according to one feature of the present invention, the exchange bonding force of the magnetic field sensing portion of the free layer to the antiferromagnetic layer having a high resistance to oxygen can be eliminated by fluorine or chlorine. Moreover, after processing with fluorine or chlorine, a stable fluoride or chloride is formed on the free layer. Accordingly, it is possible to simultaneously obtain an effect of suppressing a degradation of characteristics of the GMR film.

Further, the electrode material is a fluorine or chlorine etchable material such as Ta, TiW, and Mo. Accordingly, the step of forming the electrode terminal and the step of eliminating the bias magnetic field can be continuously performed by using the same gas, thereby making the process easy and avoiding the problem on alignment of the electrode terminal and the spin valve magnetoresistive element. As a result, it is possible to provide a spin valve magnetoresistive sensor having stable and good characteristics.

A manufacturing method for a magnetoresistive head according to a fourth preferred embodiment of the present invention will now be described with reference to FIGS. 22A to 22I and FIGS. 22A' to 22I'. FIGS. 22A to 22I are plan views, and FIGS. 22A' to 22I' are sectional views.

Figure 22A:
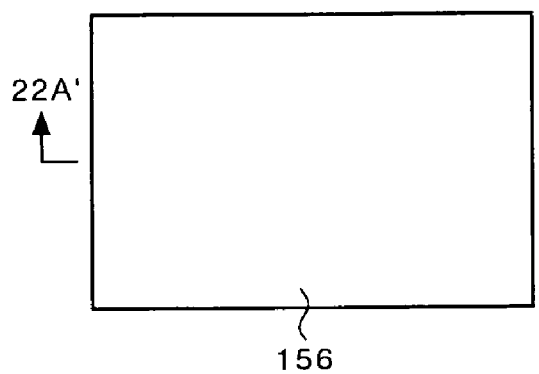
Figure 22A:
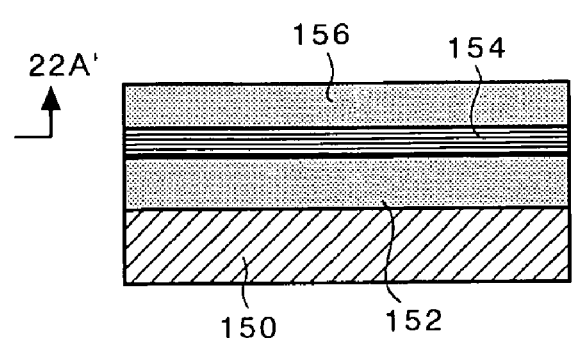

As shown in FIGS. 22A and 22A', a NiFe lower electrode 152 is formed on an $Al_2O_3$—TiC substrate 150 by sputtering. The thickness of the NiFe lower electrode 152 is preferably set in the range of 0.2 to 1.0 μm. For example, it is set to 0.5 μm. The NiFe lower electrode 152 serves also as a lower magnetic shield layer. For example, the composition of the NiFe lower electrode 152 is $Ni_{80}Fe_{20}$A spin valve film 154 is formed on the NiFe lower electrode 152 by sputtering. A NiFe protective film 156 is formed on the spin valve film 154 by sputtering. For example, the NiFe protective film 156 has a thickness of 40 nm and a composition of $Ni_{80}Fe_{20}$. The thickness of the NiFe protective film 156 is preferably set to not less than ½ of the thickness of the spin valve film 154, so as to protect the spin valve film 154 in two CMP steps to be hereinafter described.

The spin valve film 154 is formed by sequentially laminating a Ta under layer having a thickness of 5 nm, a free layer having a two-layer structure composed of a NiFe layer having a thickness of 4 nm and a CoFe layer having a thickness of 2.5 nm, a Cu intermediate layer having a thickness of 2.5 nm, a CoFe pinned layer having a thickness of 2.5 nm, and an antiferromagnetic layer formed of a PdPtMn film having a thickness of 2 to 30 nm, by sputtering as applying a magnetic field of 80 oersteds (Oe), for example. The composition of the NiFe layer in the free layer is $Ni_{81}Fe_{19}$, for example. The composition of the CoFe layer in the free layer is $Co_{90}Fe_{10}$, for example. The composition of the PdPtMn antiferromagnetic layer is $Pd_{31}Pt_{17}Mn_{52}$, for example.

Figure 22B:
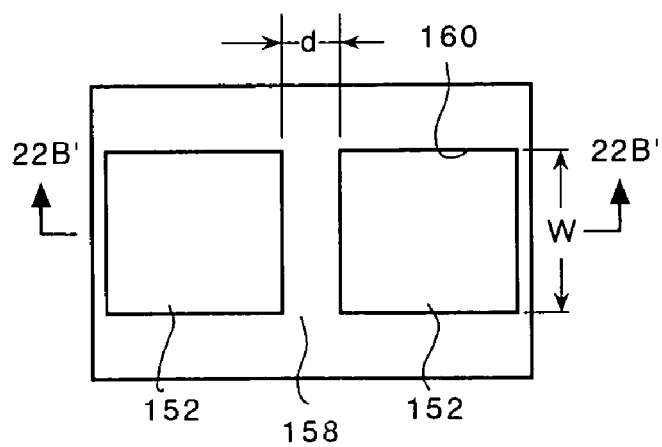
Figure 22B:
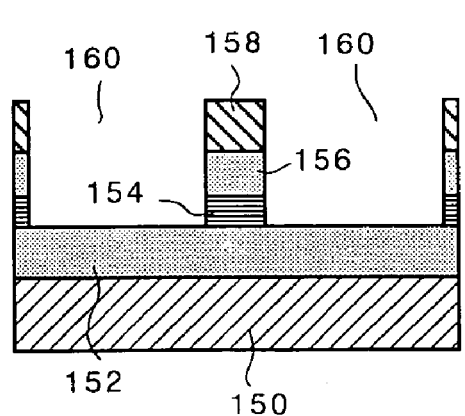

As shown in FIGS. 22B and 22B', a resist pattern 158 having rectangular openings is formed by first applying a resist on the entire surface of the NiFe protective film 156, and next performing exposure and development to the resist. Each opening of the resist pattern 158 has a width W of 2 to 6 μm, e.g., 4 μm, and the openings are spaced a distance d of 0.1 to 0.5 μm, e.g., 0.3 μm. Then, ion milling using Ar ions is performed by using the resist pattern 158 as a mask to remove the NiFe protective film 156 and the spin valve film 154 exposed to the openings, thus forming holes 160.

Figure 22C:
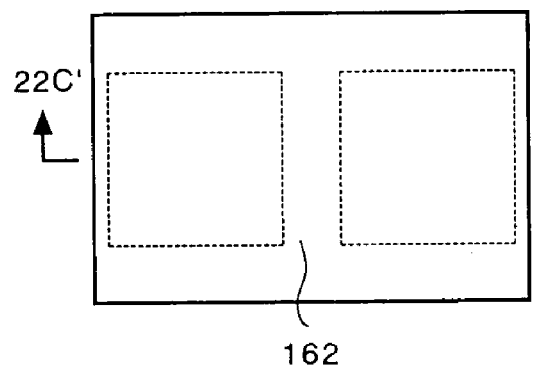
Figure 22C:
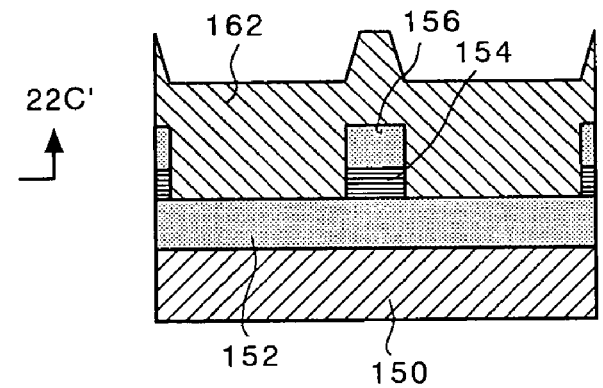
Figure 22D:
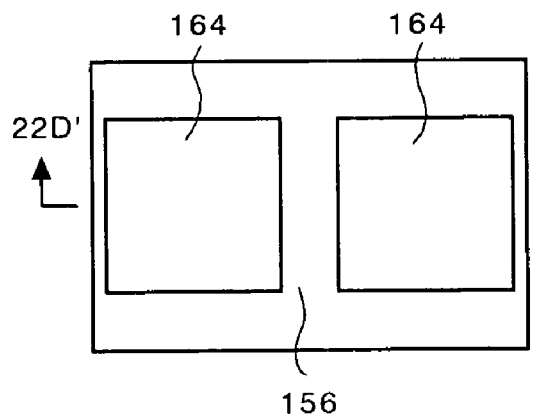
Figure 22D:
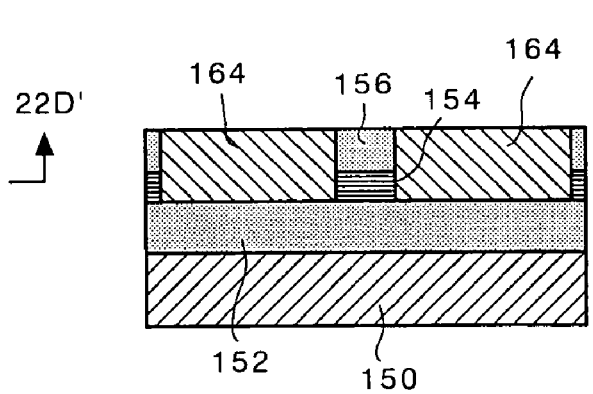

As shown in FIGS. 22C and 22C', a ferrite film 162 having a thickness of 0.2 to 1.0 µm, e.g., 0.3 µm is deposited over the substrate by sputtering. The ferrite film 162 functions as a magnetic domain control film. As shown in FIGS. 22D and 22D', the ferrite film 162 is next polished to be generally planarized until the NiFe protective film 156 is exposed, by using a CMP (chemical-mechanical polishing) process. In this condition, the holes 160 shown in FIG. 22B are filled with planarizing magnetic domain control films 164 formed of ferrite. Even when the amount of polishing becomes somewhat excessive in this CMP step, there is no possibility that the spin valve film 154 may be polished, because the NiFe protective film 156 is formed on the spin valve film 154.

Figure 22E:
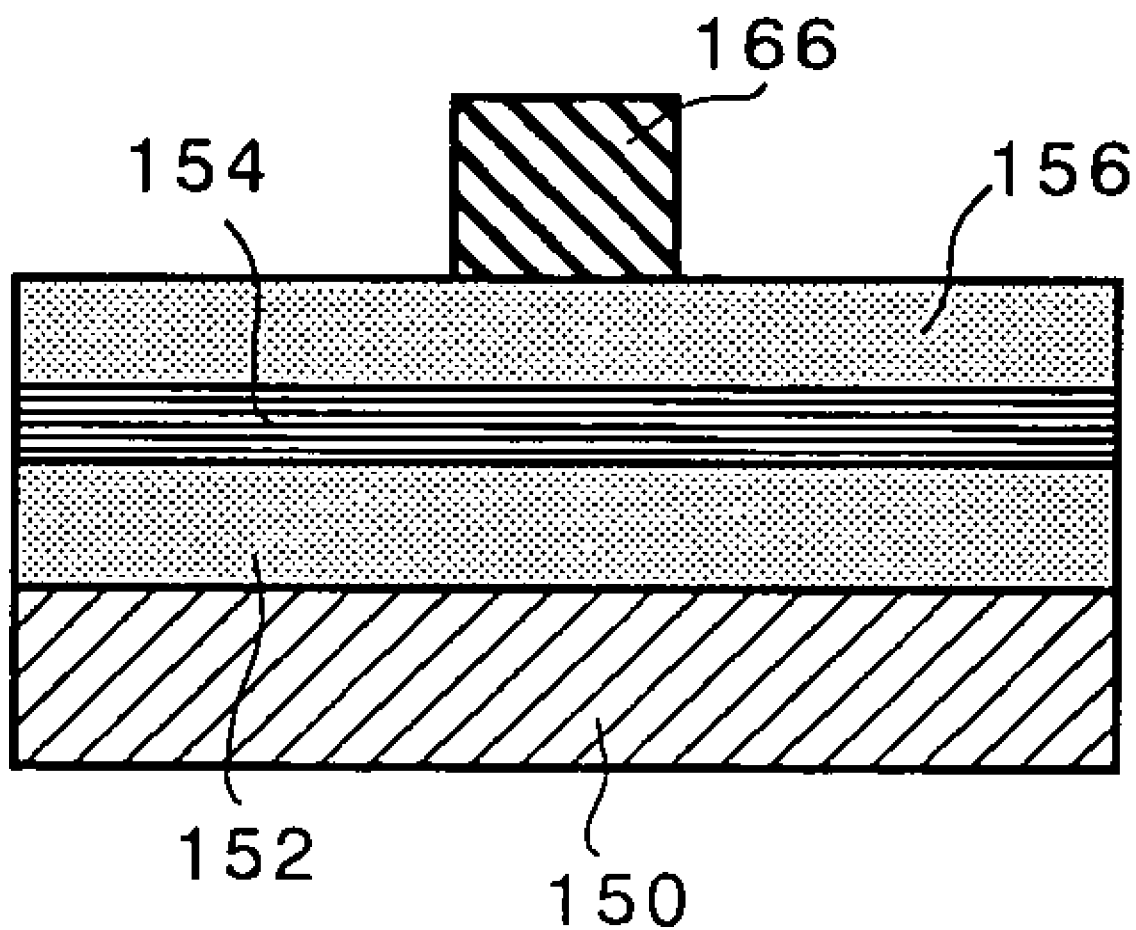
Figure 22G:
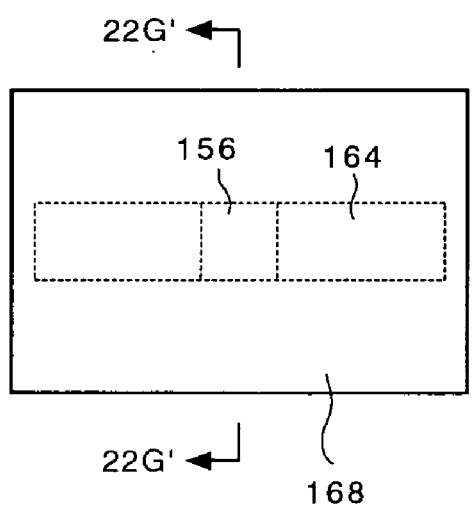
Figure 22G:
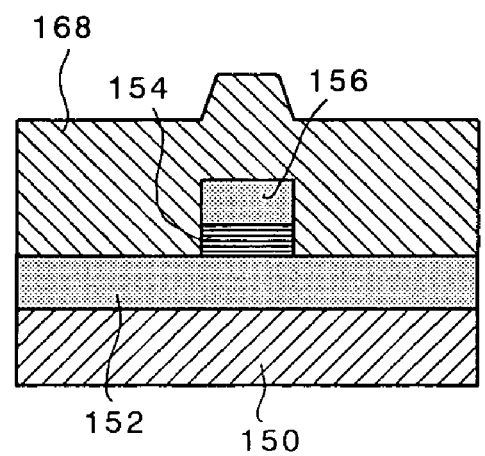

As shown in FIGS. 22E and 22E', an oblong resist pattern 166 having a width w of 1 to 5 µm, e.g., 3 µm is formed so as to overlap the adjacent planarizing magnetic domain control films 164 by first applying a resist on the NiFe protective film 156 and the magnetic domain control films 164, and next performing exposure and development to the resist. As shown in FIGS. 22F and 22F', ion milling using Ar ions is next performed by using the resist pattern 166 as a mask to thereby remove the NiFe protective film 156, the spin valve film 154, and the planarizing magnetic domain control films 164 exposed. As shown in FIGS. 22G and 22G', an $SiO_2$ film 168 having a thickness of 0.2 to 1.0 µm, e.g., 0.3 µm is deposited over the surface of the substrate by sputtering.

Figure 22H:
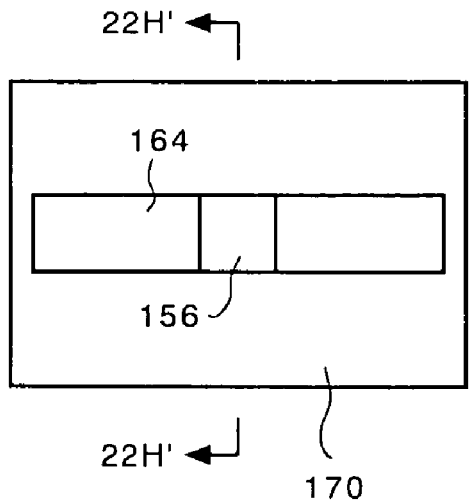
Figure 22H:
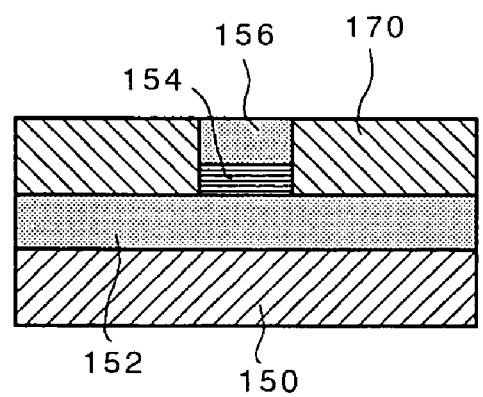
Figure 221:
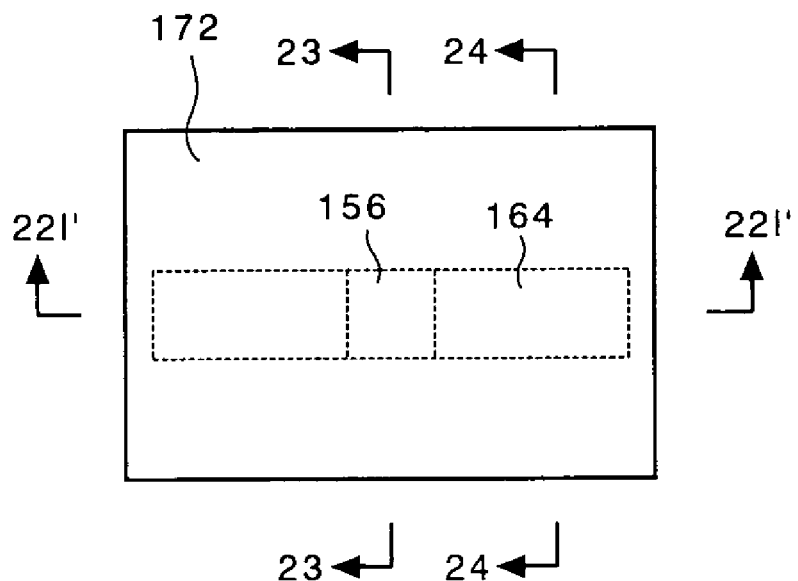
Figure 221:
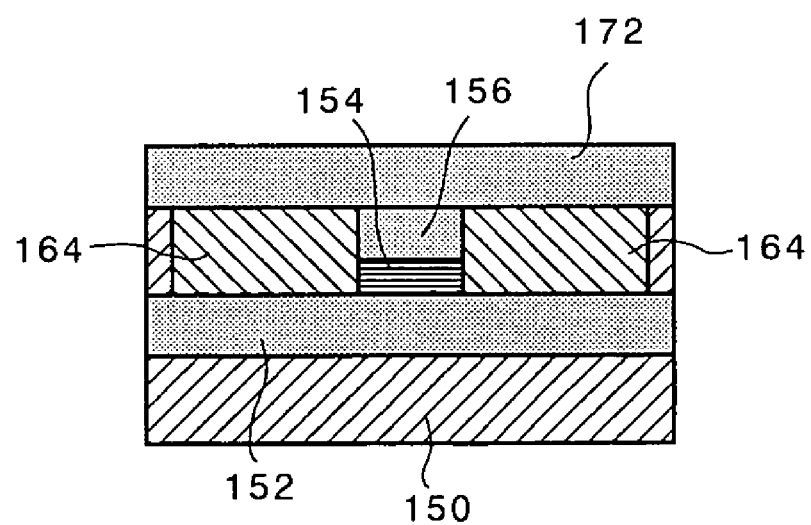

As shown in FIGS. 22H and 22H', the $SiO_2$ film 168 is polished to be generally planarized until the NiFe protective film 156 is exposed, by using a CMP process. In this condition, an ion-milled portion (etched portion) obtained in the step shown in FIGS. 22F and 22F' is filled with a planarizing layer 170 formed of $SiO_2$. Also in this CMP step, there is no possibility that the spin valve film 154 may be polished, because the NiFe protective layer 156 is formed on the spin valve film 154.

Figure 23:
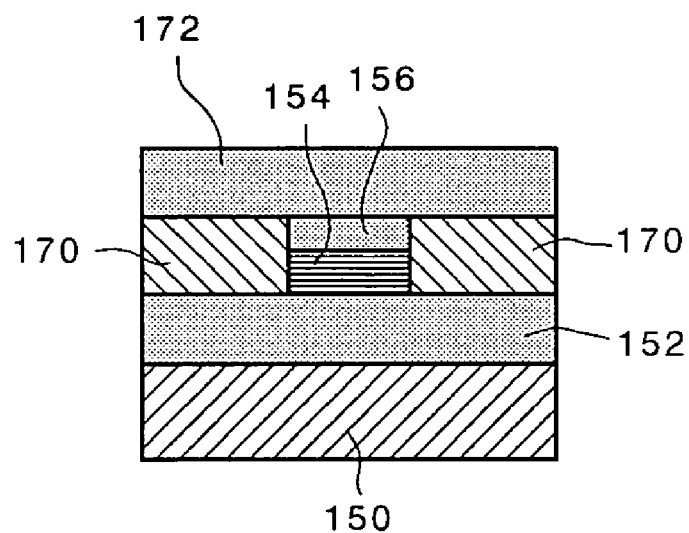
FIG. 23 is a cross section taken along the line 23—23 in FIG. 22I.
Figure 24:
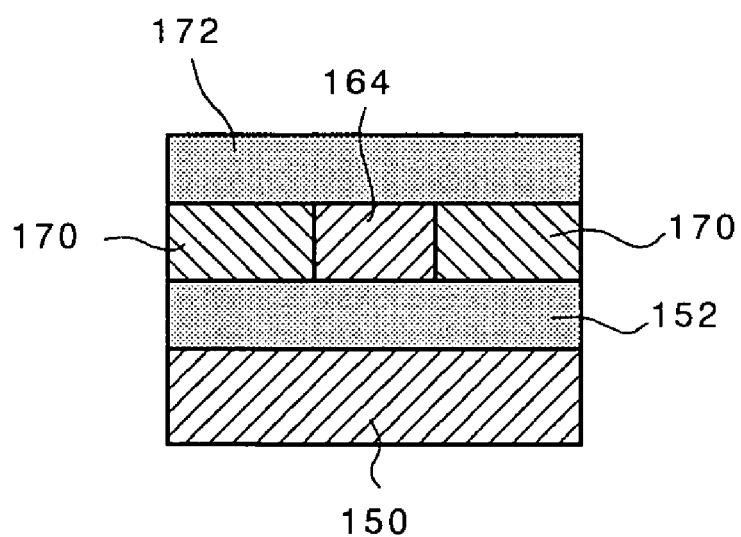
FIG. 24 is a cross section taken along the line 24—24 in FIG. 22I.

As shown in FIGS. 22I and 22I', a NiFe upper electrode 172 serving also as an upper magnetic shield layer is finally deposited over the substrate by sputtering, thus completing a magnetoresistive head having a CPP structure. The thickness of the NiFe upper electrode 172 is preferably set in the range of 0.2 to 0.8 µm. For example, it is set to 0.3 µm. The composition of the NiFe upper electrode 172 is $Ni_{80}Fe_{20}$, for example. FIG. 23 is a cross section taken along the line 23—23 in FIG. 22I, and FIG. 24 is a cross section taken along the line 24—24 in FIG. 22I.

The lower electrode 152 and the upper electrode 172 are formed of NiFe as a soft magnetic material, so that they may be magnetically coupled to the spin valve film 154. Although not shown, it is therefore necessary to interpose thin nonmagnetic metal layers of Cu or Ta for breaking the magnetic coupling between the lower electrode 152 and the spin valve film 154, between the protective film 156 and the upper electrode 172, and between the spin valve film 154 and the protective film 156. However, since the Ta film as an under layer is present between the lower electrode 152 and the spin valve film 154, it is not always necessary to provide such a nonmagnetic metal layer between the lower electrode 152 and the spin valve film 154.

In the fourth preferred embodiment mentioned above, the spin valve film 154 is planarized by using a magnetic domain control film formed of ferrite as an insulating magnetic film by adopting a CMP process, so that the spin valve film 154 can be made in contact with the NiFe upper electrode 172 without the need for a contact hole forming step and a lift-off step and without the interposition of a nonmagnetic insulating film. Further, an alignment accuracy is not necessary, thereby allowing a finer structure. Further, since the NiFe protective film 156 having a thickness not less than ½ of the thickness of the spin valve film 154 is provided on the spin valve film 154, there is no possibility of damage to the spin valve film 154 due to the polishing in the two CMP steps.

A manufacturing method for a magnetoresistive head having a CCP structure according to a fifth preferred embodiment of the present invention will now be described with reference to FIGS. 25A and 25A' and FIGS. 25B and 25B'. The manufacturing method according to the fifth preferred embodiment is similar to the manufacturing method according to the fourth preferred embodiment except the step of forming a magnetic domain control film, so only this forming step will be described below.

Figure 25A:
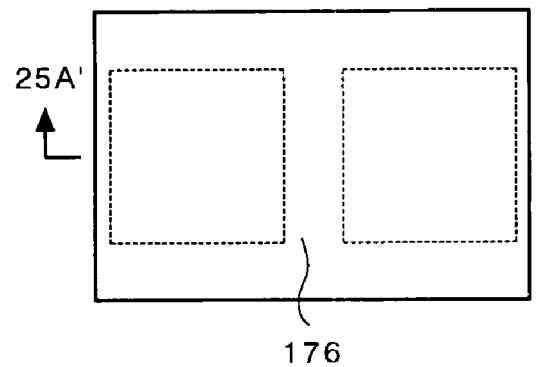
FIGS. 25A and 25B and FIGS. 25A' and 25B' are plan views and sectional views, respectively, showing a magnetoresistive head manufacturing process according to a fifth preferred embodiment of the present invention.
Figure 25A:
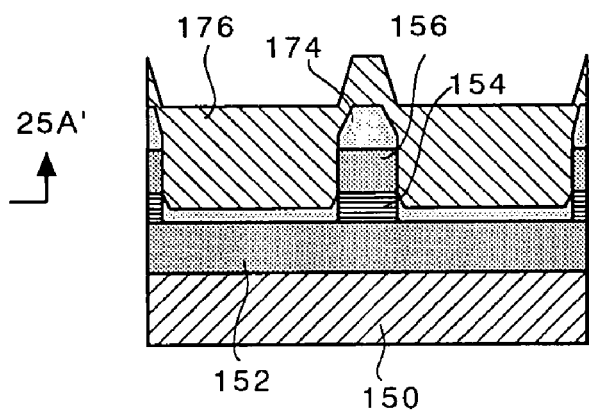

After performing the steps shown in FIGS. 22A' and 22B' of the fourth preferred embodiment to form the holes 160, the step shown in FIGS. 25A and 25A' is performed. As shown in FIGS. 25A and 25A', a CoCrPt film 174 having a thickness of 20 to 50 nm, e.g., 30 nm and an $SiO_2$ film 176 having a thickness of 0.1 to 0.5 µm, e.g., 0.2 µm are sequentially deposited over the surface of the substrate by sputtering. The CoCrPt film 174 has a composition of $Co_{78}Cr_{10}Pt_{12}$, for example.

Figure 25B:
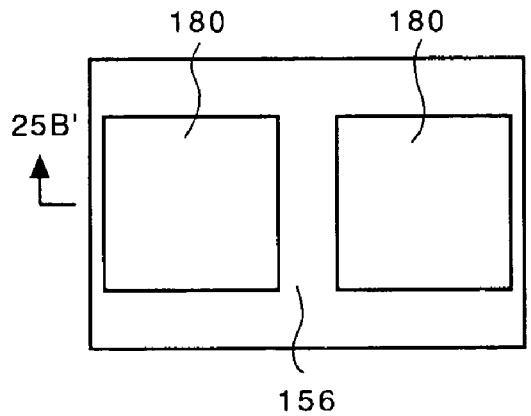
Figure 25B:
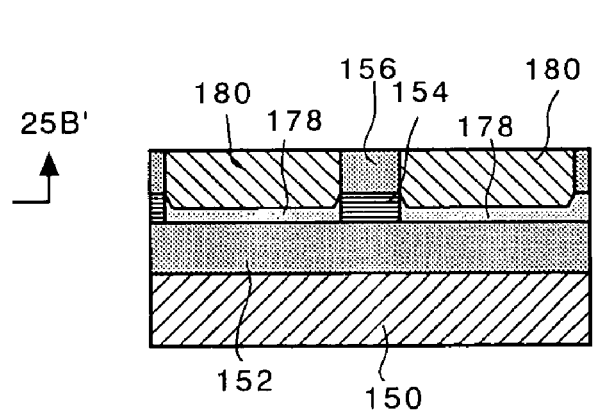

As shown in FIGS. 25B and 25B', the $SiO_2$ film 176 and the CoCrPt film 174 are polished to be generally planarized until the NiFe protective film 156 is exposed, by using a CMP process. In this condition, the holes 160 formed by ion milling are filled with planarizing insulating films 180 formed of $SiO_2$, and the side surfaces of the spin valve film 154 are covered with magnetic domain control films 178 formed of CoCrPt. The subsequent steps similar to those in the fourth preferred embodiment are performed to thereby obtain a magnetoresistive head having a CCP structure in which the spin valve film 154 is planarized by a two-layer structure composed of a conductive magnetic domain control film and a nonmagnetic insulating film. In the fifth preferred embodiment, a CoCrPt film can be used as a magnetic domain control film as in a conventional magnetoresistive head having a CIP structure, thereby allowing stable magnetic domain control.

While a spin valve film is used as a magnetoresistive film in each of the fourth and fifth preferred embodiments, the magnetoresistive film is not limited to a spin valve film in the present invention. For example, a tunnel magnetoresistive film (TMR film) or artificial lattice film which can be expected to exhibit a giant magnetoresistive effect as in the spin valve film may be used in the present invention. In the case of using the TMR film, the Cu intermediate layer in each of the fourth and fifth preferred embodiments is replaced by a tunnel insulating film. In the case of using the artificial lattice film, ferromagnetic films formed of CoFe or the like and nonmagnetic films formed of Cu or the like are alternately laminated. For example, $Co_{90}Fe_{10}$ films each having a thickness of 1.1 nm and Cu films each having a thickness of 2.1 nm are alternately laminated to configure a ten-layer structure.

While the planarizing layer 170 is formed from an $SiO_2$ film which can be easily polished by a CMP process in each of the fourth and fifth preferred embodiments, the planarizing layer is not limited to an $SiO_2$ film in the present invention, but any other insulating films such as an $Al_2O_3$ film may be used. While the $SiO_2$ film 176 is used to insulate a magnetic domain control film formed of CoCrPt in the fifth preferred embodiment, the magnetic domain control film is not limited to an $SiO_2$ film in the present invention, but any other insulating film such as an $Al_2O_3$ film may be used. While NiFe is used for the material of the protective film 156 in each of the fourth and fifth preferred embodiments, the material of the protective film is not limited to NiFe in the present invention, but any other soft magnetic materials may be used or any nonmagnetic conductive materials such as Cu may be used. In the case of using a nonmagnetic conductive material for the protective film, the nonmagnetic conductor film provided under or over the protective film to break a magnetic coupling is not necessary. Further, the protective film is not always necessary. That is, in the case that the accuracy of polishing in the CMP process is improved, the protective film is not provided but an etching step is performed after forming the spin valve film 154.

While NiFe as a soft magnetic material is used as the material of the upper electrode, the lower electrode, or the protective film in each of the fourth and fifth preferred embodiments, this material is not limited to NiFe in the present invention, but any other soft magnetic materials such as FeN and Fe may be used. Further, the upper electrode and the lower electrode are not necessarily formed of a soft magnetic material, but a nonmagnetic good conductor such as Cu may be used. In this case, it is necessary to provide an upper magnetic shield layer and a lower magnetic shield layer outside the upper electrode and the lower electrode, resulting in an increase in gap length. While the NiFe lower electrode 152 is formed directly on the $Al_2O_3$—TiC substrate 150 in each of the fourth and fifth preferred embodiments, an $Al_2O_3$ film having a thickness of about 2 μm may be formed on the $Al_2O_3$—TiC substrate 150 by sputtering before forming the NiFe lower electrode 152.

While the $SiO_2$ film is deposited by sputtering in each of the fourth and fifth preferred embodiments, the deposition method for the $SiO_2$ film is not limited to sputtering in the present invention, but a CVD process may be used in consideration of step coverage. While the CMP process is used in planarizing the magnetic domain control film or the planarizing layer in the above preferred embodiments, the planarization method is not limited to the CMP process, but a lapping process or an etchback process may be used.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A magnetoresistive sensor including a multilayer current perpendicular to the plane structure having a first conductor layer, a second conductor layer, and a magnetoresistive film provided between said and second conductor layers, wherein said magnetoresistive film comprises:

a free ferromagnetic layer provided on said first conductor layer;

a nonmagnetic intermediate layer provided on said free ferromagnetic layer;

a pinned ferromagnetic layer provided on said nonmagnetic intermediate layer; and an antiferromagnetic layer provided on said pinned ferromagnetic layer; and further wherein the thickness of at least one of said free ferromagnetic layer and said pinned ferromagnetic layer falls in the range of 0.5 to 2.0 times the mean free path of conduction electrons in a spin direction not spin-dependently scattered in a magnetization direction of said at least one layer.

2. A magnetoresistive sensor according to claim 1, wherein the thickness of at least one of said free ferromagnetic layer and said pinned ferromagnetic layer falls in the range of 3 nm to 12 nm.

3. A magnetoresistive sensor according to claim 2, wherein said free ferromagnetic layer and said pinned ferromagnetic layer are formed of a material selected from the group consisting of Co, CoFe, CoFeB, and NiFe.

4. A magnetoresistive sensor according to claim 1, wherein said pinned ferromagnetic layer has a laminated ferri structure.

5. A magnetoresistive sensor according to claim 1, wherein said free ferromagnetic layer has a laminated ferri structure.

6. A magnetoresistive sensor according to claim 5, wherein said nonmagnetic intermediate layer is formed of Cu, and has a thickness falling in the range of 4 nm to 6 nm.

7. A magnetoresistive sensor according to claim 1, wherein said nonmagnetic intermediate layer has a thickness larger than that providing a maximum resistance change rate or resistance change amount in the case of passing a current in an in-plane direction.

8. A magnetoresistive sensor according to claim 1, wherein said magnetoresistive film comprises a spin valve film having said free ferromagnetic layer and said pinned ferromagnetic layer.

* * * * *

UNITED STATES PATENT AND TRADEMARK OFFICE
CERTIFICATE OF CORRECTION

PATENT NO. : 6,995,960 B2
APPLICATION NO. : 09/820047
DATED : February 7, 2006
INVENTOR(S) : Yoshihiko Seyama It is certified that error appears in the above-identified patent and that said Letters Patent is hereby corrected as shown below:

On the title page:
  Item (75) Inventors, delete the following inventors' names: "Reiko Kondo, Hitoshi Kishi, Junya Ikeda".

In the Claims:
  Col. 24, line 2, delete "said and second" and insert --said first and second--.

Signed and Sealed this

Eighteenth Day of July, 2006

JON W. DUDAS
*Director of the United States Patent and Trademark Office*